US012379439B1

(12) United States Patent
Short, Jr. et al.

(10) Patent No.: US 12,379,439 B1
(45) Date of Patent: Aug. 5, 2025

(54) RF MATERIAL DETECTION DEVICE WITH SMART SCANNING MULTIPLE AXIS GIMBAL INTEGRATED WITH HAPTICS

(71) Applicant: QUANTUM IP, LLC, Stuart, FL (US)

(72) Inventors: Robert J. Short, Jr., Stuart, FL (US); Lee Duke, Stuart, FL (US); John Cronin, Stuart, FL (US); Michael D'Andrea, Stuart, FL (US); Joseph Bodkin, Stuart, FL (US)

(73) Assignee: QUANTUM IP, LLC, Stuart, FL (US)

( * ) Notice: Subject to any disclaimer, the term of this patent is extended or adjusted under 35 U.S.C. 154(b) by 0 days.

(21) Appl. No.: 18/939,132

(22) Filed: Nov. 6, 2024

Related U.S. Application Data

(60) Provisional application No. 63/668,717, filed on Jul. 8, 2024.

(51) Int. Cl.
  *G01R 33/44* (2006.01)
  *G01N 24/08* (2006.01)
  (Continued)

(52) U.S. Cl.
  CPC ......... *G01R 33/441* (2013.01); *G01N 24/084* (2013.01); *G01R 33/34* (2013.01); *G01R 33/546* (2013.01)

(58) Field of Classification Search
  CPC .... G01R 33/441; G01R 33/34; G01R 33/546; G01N 24/084
  See application file for complete search history.

(56) References Cited

U.S. PATENT DOCUMENTS

| 2,116,717 A | 5/1938 | Hans |
| 3,725,917 A | 4/1973 | Sletten et al. |
(Continued)

FOREIGN PATENT DOCUMENTS

| CN | 107102325 | 8/2017 |
| CN | 117091456 | 11/2023 |
(Continued)

OTHER PUBLICATIONS

Hideo Itozaki et al. "Nuclear Quadrupole Resonance for Explosive Detection", International Journal on Smart Sensing and Intelligent systems, vol. 1, No. 3, Sep. 2008. (Year: 2008).*
(Continued)

*Primary Examiner* — G. M. A Hyder
(74) *Attorney, Agent, or Firm* — Polsinelli LLP

(57) ABSTRACT

A method for material detection is described. The method may include extracting, from a material database, a resonance frequency for the target material. The method may further include comparing an application type to entries in a scan database. The scan database may store pre-defined scanning patterns and corresponding application types. The method may include extracting, from the scan database, a scan sequence for the application type. Also, the method may include instructing a gimbal to follow positions in the scan sequence. The method may also include transmitting into an environment an RF signal when the gimbal is at the positions in the scan sequence. The method may further include receiving a response signal from the environment. The method may include analyzing the response signal for resonance characteristics that indicate a presence of the target material. Additionally, the method may include generating a haptic feedback when the target material is detected.

19 Claims, 5 Drawing Sheets

(51) Int. Cl.
*G01R 33/34* (2006.01)
*G01R 33/54* (2006.01)

(56) References Cited

U.S. PATENT DOCUMENTS

| | | | |
|---|---|---|---|
| 3,983,558 | A | 9/1976 | Rittenbach |
| 4,132,943 | A | 1/1979 | Gournay et al. |
| 4,217,585 | A | 8/1980 | Fishbein et al. |
| 4,296,378 | A | 10/1981 | King |
| 4,514,691 | A | 4/1985 | De Los Santos et al. |
| 4,897,660 | A | 1/1990 | Gold et al. |
| 5,227,800 | A | 7/1993 | Huguenin et al. |
| 5,233,300 | A | 8/1993 | Buess et al. |
| 5,592,083 | A | 1/1997 | Magnuson et al. |
| 5,745,071 | A | 4/1998 | Blackmon et al. |
| 6,297,765 | B1 | 10/2001 | Frazier et al. |
| 6,359,582 | B1 | 3/2002 | MacAleese et al. |
| 6,967,612 | B1 | 11/2005 | Gorman et al. |
| 7,251,310 | B2 | 7/2007 | Smith |
| 7,288,927 | B2 | 10/2007 | Nutting et al. |
| 7,405,692 | B2 | 7/2008 | McMakin et al. |
| 7,825,648 | B2 | 11/2010 | Nutting et al. |
| 8,138,770 | B2 | 3/2012 | Pechmann et al. |
| 8,188,862 | B1 | 5/2012 | Tam et al. |
| 8,242,447 | B1 | 8/2012 | Chawla |
| 8,242,450 | B2 | 8/2012 | Gaziano |
| 8,502,666 | B1 | 8/2013 | Tam et al. |
| 8,890,745 | B2 | 11/2014 | Wahlquist et al. |
| 9,182,481 | B2 | 11/2015 | Bowring et al. |
| 9,500,609 | B1 | 11/2016 | Zank |
| 9,915,727 | B1 | 3/2018 | Reznack et al. |
| 10,204,775 | B2 | 2/2019 | Brown et al. |
| 10,229,328 | B2 | 3/2019 | Nikolova et al. |
| 10,268,889 | B2 | 4/2019 | Brown et al. |
| 10,816,658 | B2 | 10/2020 | Frizzell |
| 10,890,656 | B2 | 1/2021 | Heinen |
| 11,280,898 | B2 | 3/2022 | Morton |
| 11,422,252 | B2 | 8/2022 | Bowring et al. |
| 11,493,494 | B2 | 11/2022 | Wilson et al. |
| 12,248,062 | B1 | 3/2025 | Short et al. |
| 2002/0008655 | A1 | 1/2002 | Haj-Yousef |
| 2003/0196543 | A1* | 10/2003 | Moser ............... F41H 11/16 89/1.13 |
| 2004/0039713 | A1 | 2/2004 | Beck |
| 2004/0125020 | A1 | 7/2004 | Hendler et al. |
| 2004/0232054 | A1 | 11/2004 | Brown et al. |
| 2004/0252062 | A1 | 12/2004 | Tracy et al. |
| 2005/0081634 | A1 | 4/2005 | Matsuzawa |
| 2005/0200528 | A1 | 9/2005 | Carrender et al. |
| 2005/0230604 | A1 | 10/2005 | Rowe et al. |
| 2006/0008051 | A1 | 1/2006 | Heaton et al. |
| 2007/0074580 | A1 | 4/2007 | Fallah-Rad et al. |
| 2007/0115183 | A1 | 5/2007 | Kim et al. |
| 2007/0188377 | A1 | 8/2007 | Krikorian et al. |
| 2008/0283761 | A1 | 11/2008 | Robinson et al. |
| 2009/0085565 | A1 | 4/2009 | Fullerton |
| 2009/0195435 | A1 | 8/2009 | Kapilevich et al. |
| 2009/0262005 | A1 | 10/2009 | McNeill et al. |
| 2010/0046704 | A1 | 2/2010 | Song et al. |
| 2010/0079280 | A1 | 4/2010 | Lacaze et al. |
| 2010/0128852 | A1 | 5/2010 | Yamamoto et al. |
| 2010/0134102 | A1 | 6/2010 | Crowley |
| 2010/0164831 | A1 | 7/2010 | Rentz et al. |
| 2010/0182594 | A1 | 7/2010 | Carron |
| 2011/0050241 | A1 | 3/2011 | Nutting et al. |
| 2011/0233419 | A1 | 9/2011 | Norris |
| 2012/0248313 | A1 | 10/2012 | Karam et al. |
| 2012/0256779 | A1 | 10/2012 | Nguyen et al. |
| 2015/0160181 | A1 | 6/2015 | White et al. |
| 2016/0011307 | A1 | 1/2016 | Casse et al. |
| 2016/0047757 | A1 | 2/2016 | Kuznetsov et al. |
| 2016/0124071 | A1 | 5/2016 | Baxley et al. |
| 2016/0166843 | A1 | 6/2016 | Casse et al. |
| 2016/0195608 | A1 | 7/2016 | Ruenz |
| 2016/0223666 | A1 | 8/2016 | Kim et al. |
| 2016/0274230 | A1 | 9/2016 | Wu et al. |
| 2016/0327634 | A1 | 11/2016 | Katz et al. |
| 2017/0011255 | A1 | 1/2017 | Kaditz et al. |
| 2017/0350834 | A1 | 12/2017 | Prado et al. |
| 2018/0067204 | A1 | 3/2018 | Frizzell |
| 2019/0137653 | A1 | 5/2019 | Starr et al. |
| 2019/0154439 | A1 | 5/2019 | Binder |
| 2019/0208112 | A1 | 7/2019 | Kleinbeck |
| 2019/0219687 | A1 | 7/2019 | Baheti et al. |
| 2020/0166634 | A1 | 5/2020 | Peleg |
| 2020/0173970 | A1 | 6/2020 | Wilson et al. |
| 2020/0264298 | A1 | 8/2020 | Haseltine et al. |
| 2020/0333412 | A1 | 10/2020 | Nichols et al. |
| 2020/0371227 | A1 | 11/2020 | Malhi |
| 2021/0041376 | A1 | 2/2021 | Ashiwal et al. |
| 2021/0096240 | A1 | 4/2021 | Padmanabhan et al. |
| 2021/0312201 | A1 | 10/2021 | Hastings et al. |
| 2021/0373098 | A1 | 12/2021 | Fraundorfer et al. |
| 2022/0171017 | A1 | 6/2022 | McFadden et al. |
| 2022/0265882 | A1 | 8/2022 | Lemchen |
| 2022/0311135 | A1 | 9/2022 | Guo et al. |
| 2022/0365168 | A1 | 11/2022 | Amizur et al. |
| 2022/0408643 | A1 | 12/2022 | Somarowthu et al. |
| 2023/0243761 | A1 | 8/2023 | Somarowthu et al. |
| 2023/0375695 | A1 | 11/2023 | Tan |
| 2024/0036166 | A1 | 2/2024 | Geng et al. |
| 2024/0372600 | A1 | 11/2024 | Schreck et al. |

FOREIGN PATENT DOCUMENTS

| | | |
|---|---|---|
| JP | 2014095625 | 5/2014 |
| WO | WO 2024091157 | 5/2024 |

OTHER PUBLICATIONS

PCT Application No. PCT/US2024/039348, International Search Report and Written Opinion dated Oct. 17, 2024.
U.S. Appl. No. 18/921,840, US, Robert J. Short Jr., RF-Based Material Detection Device That Uses Specific Antennas Designed for Specific Substances, Oct. 21, 2024.
U.S. Appl. No. 18/922,682, US, Robert J. Short Jr., Enhanced Antenna Materials for Low-Frequency Detection of Materials, Oct. 22, 2024.
U.S. Appl. No. 18/922,693, US, Robert J. Short Jr., Dynamic Phased Array Resonator Systems and Methods for Determining a Material Substance, Oct. 22, 2024.
U.S. Appl. No. 18/923,518, US, Robert J. Short Jr., Currency RF-Based Verification Device, Oct. 22, 2024.
U.S. Appl. No. 18/922,702, US, Robert J. Short Jr., Enhanced Material Detection and Frequency Sweep Analysis of Controlled Substances Via Digital Signal Processing, Oct. 22, 2024.
U.S. Appl. No. 18/922,729, US, Robert J. Short Jr., RF-Based Detection Device for Material Identification Using a Smart Frequency Selection Method, Oct. 22, 2024.
U.S. Appl. No. 18/929,189, US, Robert J. Short Jr., RF-Specific Material Detection Device for an Application-Specific Device, Oct. 28, 2024.
U.S. Appl. No. 18/782,964, US, Robert J. Short Jr., RF-Based Material Identification Systems and Methods, Jul. 24, 2024.
PCT/US2024/039348, WO, Robert J. Short Jr., RF-Based Material Identification Systems and Methods, Jul. 24, 2024.
U.S. Appl. No. 18/934,569, US, Robert J. Short Jr., Networked RF Material Devices for Substance Detection Via Opposed Perimeter Sensors, Nov. 1, 2024.
U.S. Appl. No. 18/938,584, US, Robert J. Short Jr., RF Transmit and Receiver Antenna Detector System, Nov. 6, 2024.
U.S. Appl. No. 18/936,177, US, Robert J. Short Jr., Method and System for Detecting and Quantifying Specific Substances, Elements, or Conditions Utilizing an AI Module, Nov. 4, 2024.
U.S. Appl. No. 18/942,906, US, Robert J. Short Jr., RF-Specific Material Detection Device Integrated Into Application-Specific Drone Device, Nov. 11, 2024.
U.S. Appl. No. 18/936,500, US, Robert J. Short Jr., RF-Based Special Material Detection System With Secure Multi-Dimensional Authentication, Nov. 4, 2024.

(56) References Cited

OTHER PUBLICATIONS

U.S. Appl. No. 18/938,691, US, Robert J. Short Jr., RF-Based AI Determination of Materials by Cycling Through Detection Patterns for Specific Applications, Nov. 6, 2024.
U.S. Appl. No. 18/946,014, US, Robert J. Short Jr., RF-Based Special Material Detection Securing Entry Points and Access, Nov. 13, 2024.
U.S. Appl. No. 18/922,693, Non-Final Office Action dated Nov. 26, 2024.
U.S. Appl. No. 18/922,729, Non-Final Office Action dated Dec. 16, 2024.
U.S. Appl. No. 18/929,189, Non-Final Office Action dated Jan. 24, 2025.
U.S. Appl. No. 18/782,964, Non-Final Office Action dated Dec. 6, 2024.
U.S. Appl. No. 18/936,177, Non-Final Office Action dated Jan. 21, 2025.
U.S. Appl. No. 18/936,500, Non-Final Office Action dated Dec. 23, 2024.
U.S. Appl. No. 18/946,014, Non-Final Office Action dated Jan. 16, 2025.
Erricolo et al., "Machine Learning in Electromagnetics: A Review and Some Perspectives for Future Research," 2019 International Conference on Electromagnetics in Advanced Applications (ICEAA), Granada, Spain, 2019, pp. 1377-1380, doi: 10.1109/ICEAA.2019.8879110.
Ibrahim et al., "A Subspace Signal Processing Technique for Concealed Weapons Detection," 2007 IEEE International Conference on Acoustics, Speech and Signal Processing—ICASSP '07, Honolulu, HI, USA, pp. II-401-II-404, doi: 10.1109/ICASSP.2007.366257, 2007.
U.S. Appl. No. 18/921,840, Non-Final Office Action dated Feb. 28, 2025.
U.S. Appl. No. 18/922,693, Final Office Action dated Mar. 17, 2025.
U.S. Appl. No. 18/938,584, Non-Final Office Action dated Feb. 24, 2025.
U.S. Appl. No. 18/922,693, Non-Final Office Action dated Jun. 4, 2025.
U.S. Appl. No. 18/929,189, Final Office Action dated Jun. 23, 2025.

\* cited by examiner

RF MATERIAL DETECTION DEVICE WITH SMART SCANNING MULTIPLE AXIS GIMBAL INTEGRATED WITH HAPTICS

CROSS REFERENCE TO RELATED APPLICATION

The present application claims the benefit of priority to U.S. Provisional Patent Application No. 63/668,717, entitled "RF MATERIAL DETECTION DEVICE WITH SMART SCANNING MULTIPLE AXIS GIMBAL INTEGRATED WITH HAPTICS," filed Jul. 8, 2024, the entire contents of which are incorporated herein by reference for all purposes.

FIELD OF THE DISCLOSURE

The present disclosure is generally related to an RF material detection device. The RF material detection device may include a smart scanning multiple-axis gimbal integrated with haptics.

BACKGROUND

Current methods lack the precision needed for accurately detecting and localizing small or hidden materials within a given environment. Many existing scanning techniques are either invasive or inefficient, requiring significant time and manual intervention. Also, traditional detection systems often fail to provide comprehensive data, leading to incomplete or inaccurate assessments. Operators frequently struggle with delayed or unclear feedback from detection systems, complicating decision-making processes. Lastly, manual control of scanning devices can lead to human error and inconsistent coverage. Existing devices may not adapt well to different environmental conditions, impacting their effectiveness. Thus, there is a need for an RF material detection device with smart scanning multiple-axis gimbal integrated with haptics.

SUMMARY

Embodiments include methods and systems for material detection and identification. A gimbal may be used to position antennas at coordinates for an application type. The antennas may follow a scanning pattern to sufficiently cover a target area. The system may generate haptic feedback to aid in detection.

In some aspects, the techniques described herein relate to a method for material detection and identification. The method includes accessing a material database for a target material. The material database may store data on a plurality of materials and corresponding resonance frequencies. The method may also include extracting, from the material database, a resonance frequency for the target material. The method may further include comparing an application type to entries in a scan database. The scan database may store pre-defined scanning patterns and corresponding application types. The method may include extracting, from the scan database, a scan sequence for the application type. Also, the method may include instructing a gimbal to follow positions in a pre-defined scanning pattern of the scan sequence. The method may also include transmitting into an environment an RF signal at the resonance frequency when the gimbal is at the positions in the pre-defined scanning pattern of the scan sequence. The method may further include receiving a response signal from the environment. The method may include analyzing the response signal for resonance characteristics that indicate a presence of the target material. Additionally, the method may include generating a haptic feedback when the target material is detected.

In some aspects, the techniques described herein relate to a method, where the positions in the pre-defined scanning pattern include X, Y, Z coordinates of the gimbal.

In some aspects, the techniques described herein relate to a method, where the positions in the pre-defined scanning pattern include pitch, yaw, roll orientations of the gimbal.

In some aspects, the techniques described herein relate to a method, where the application type is a medical application, and the pre-defined scanning pattern is configured to cover an organ of interest.

In some aspects, the techniques described herein relate to a method, where the application type is a medical application, and the pre-defined scanning pattern is configured to cover a tumor.

In some aspects, the techniques described herein relate to a method, where the application type is a military application, and the pre-defined scanning pattern is configured to cover a vehicle.

In some aspects, the techniques described herein relate to a method, further including storing positioning data associated with transmitting in a detection database.

In some aspects, the techniques described herein relate to a method, where the positioning data includes a spatial extent or a volume occupied by the target material.

In some aspects, the techniques described herein relate to a method, where an intensity of the haptic feedback is related to a strength of the response signal.

In some aspects, the techniques described herein relate to a method, where a pattern of the haptic feedback is related to a strength of the response signal.

In some aspects, the techniques described herein relate to a method, where the haptic feedback is a first haptic feedback. The method further includes generating a second haptic feedback to indicate progress of the gimbal through the positions in the pre-defined scanning pattern of the scan sequence.

Some aspects relate to a system for material detection and identification. The system may include an RF transmitter unit configured to transmit into an environment an RF signal at a resonance frequency. The system may also include an RF receiver unit configured to receive a response signal from the environment. The system may further include a multi-axis gimbal operably coupled to at least one of an RF transmitter antenna and an RF receiver antenna. The multi-axis gimbal may be configured to position at least one of the RF transmitter antenna and the RF receiver antenna. Additionally, the system may include a position detector sensor configured to provide a position of the multi-axis gimbal. The system may include a scan module configured to control the position of the multi-axis gimbal. The system may also include a haptics feedback apparatus configured to indicate the position of the multi-axis gimbal or an intensity of the response signal.

In some aspects, the system may further include a computer-readable medium storing a scan database, where the scan database includes pre-defined scanning patterns and corresponding application types.

In some aspects, the system may further include a computer-readable medium storing a materials database, where the materials database includes data on a plurality of materials and corresponding resonance frequencies.

In some aspects, the system may further include a computer-readable medium storing a detection database, where the detection database includes data on materials detected by the system.

In some aspects, the data on materials detected by the system includes locations of the materials detected by the system.

In some aspects, the system may further include a processor configured to analyze the response signal for resonance characteristics that indicate a presence of a material and identifying the material to a user if the presence of the material is indicated by the resonance characteristics.

In some aspects, the system may further include a directional shield configured to direct or block electromagnetic radiation in a specific direction.

In some aspects, the position detector sensor includes an encoder, gyroscope, or an accelerometer.

In some aspects, the haptics feedback apparatus includes a vibration motor, a linear resonant actuator, a piezoelectric actuator, or an electroactive polymer.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Embodiments include a method and system for detecting and estimating tumor volumes uses a gimbal-mounted cone for sweeping scans. Phased array antennas emit pulses at specific frequencies that interact with tumor tissue, enabling detection and volume estimation through lock-to-lock sweeping. The electronically controlled gimbal sweeps across a predetermined range, eliminating manual rotation. Constructive and destructive interference patterns from the antennas triangulate the tumor's position and size, aiding in diagnostics and treatment planning. Additionally, the system employs sensors transmitting low-frequency interrogation codes, using the duration of the tumor's non-response period (lockout) to precisely calculate its size.

Figure 1:
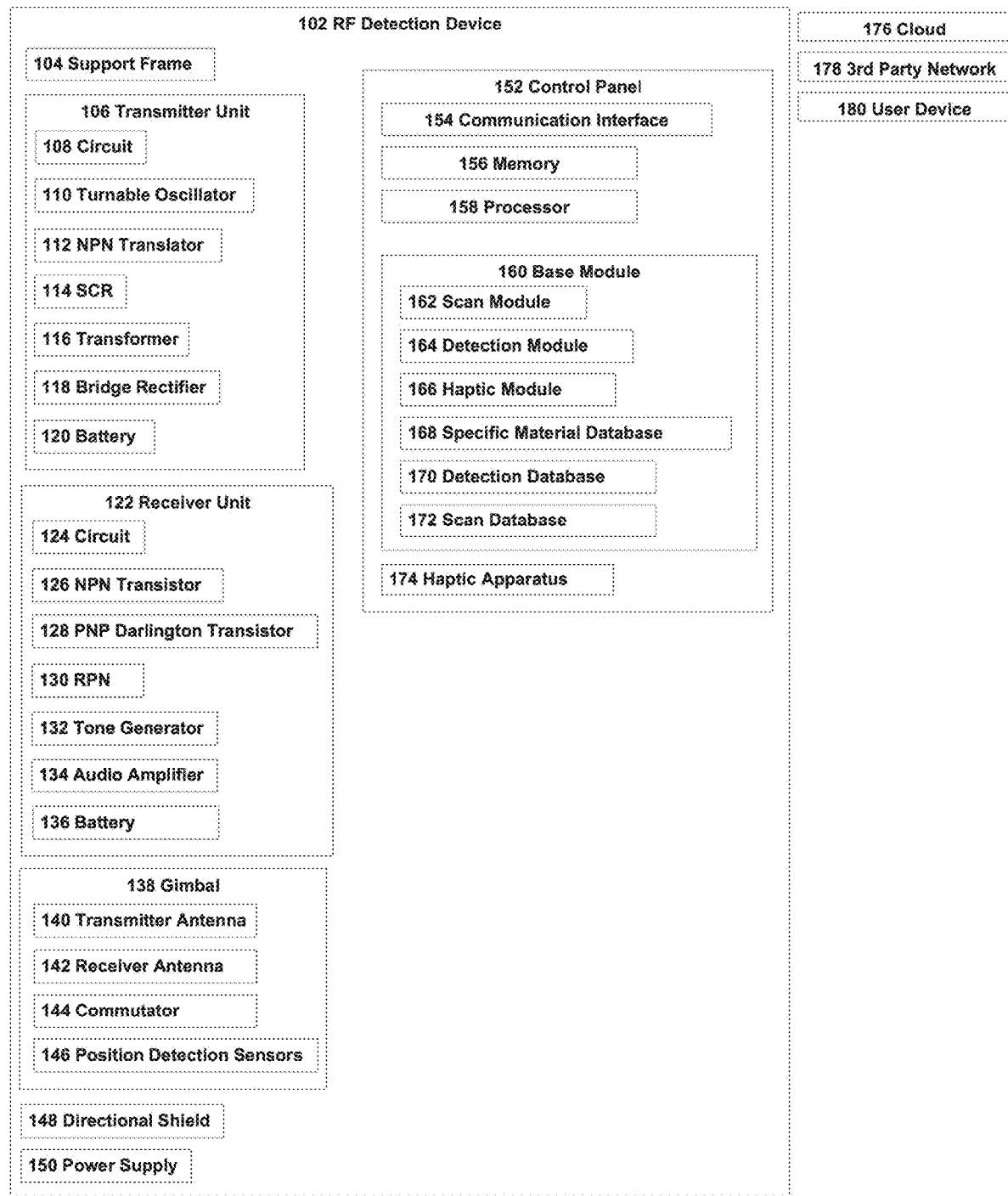
FIG. 1 illustrates an RF material detection device with smart scanning multiple axis gimbal integrated with haptics according to an embodiment.

FIG. 1 illustrates a system for an RF material detection device with a smart scanning multiple-axis gimbal integrated with haptics. This system includes an RF detection device 102, which may be a specialized system designed to detect and identify specific materials based on their unique resonance frequencies when exposed to electromagnetic signals. The RF detection device 102 incorporates an RF detection system similar to that disclosed in U.S. Pat. No. 11,493,494 B2, the entire contents of which are incorporated herein by reference for all purposes. The system may employ RF signals for the detection and identification of materials based on their resonance characteristics. The RF detection device 102 may operate by transmitting RF signals into the environment and analyzing the received signals for resonance characteristics that indicate the presence of a target material. The RF detection device 102 may be designed to detect a target material based on its resonance properties with specific RF frequencies. It utilizes the principle that materials resonate at particular frequencies when exposed to external RF signals, allowing for their identification and potential quantification. The RF detection device 102 may include a transmitter unit 106, a receiver unit 122, a control panel 152, a transmitter antenna 140, a receiver antenna 142, a directional shield 148, and a power supply 150. Upon activation, the control panel 152 initializes the system, powering up the transmitter unit 106, the receiver unit 122, and associated electronics. The control panel 152 may instruct the transmitter unit 106 to generate RF signals at specified frequencies, such as 180 Hz, 1800 Hz, etc., and amplitudes, such as 320V, 160V, etc., known to or determined to resonate with a target material. The transmitter unit 106 emits these RF signals through the transmitter antenna 140 into the testing environment. The receiver unit 122 captures the RF signals using the receiver antenna 142. It then processes the received signals to identify resonance frequencies that indicate the presence of the target material.

Further, embodiments may include a support frame 104, which may be a structural component designed to provide stability and support to various subsystems and components of the RF detection device 102. The support frame 104 may provide proper alignment and positioning of the components, such as the transmitter unit 106, receiver unit 122, and control panel 152. The support frame 104 may provide mounting points and secure attachment locations for subsystems such as the transmitter unit 106, receiver unit 122, and control panel 152. By maintaining precise alignment and stability, the support frame 104 may minimize vibrations and unwanted movements that could interfere with the accuracy of RF signal transmission and reception. In some embodiments, the support frame 104 may be constructed from durable materials such as metal alloys or rigid polymers.

Further, embodiments may include a transmitter unit 106, which may include an electronic circuit 108, powered by a battery 120, such as a 12-volt, 1.2 amp battery, with a regulated output of nine volts. The circuit 108 may use a 555 timer as a tunable oscillator 110 to generate a pulse rate. The output of the oscillator 110 is fed in parallel to an NPN transistor 112 and a silicon-controlled rectifier or SCR 114. The transistor may be used as a common emitter amplifier stage driving a transformer 116. The transformer 116 may be used to step up the voltage as desired. The balanced output of the transformer 116 feeds a bridge rectifier 118. The rectified direct current flows through a 100 K, three-watt resistor to terminal B of the transmitter antenna 140. A plurality of resistors and capacitors may fill in the circuit 108. In some embodiments, the transmitter antenna 140 may be formed from a coil of about 25 meters of 14-strand wire tightly wound around a one-centimeter PVC core. The transmitter antenna 140 may be, in one exemplary embodiment, in a 1"×3" configuration at the bottom end of the support frame 104. In some embodiments, the transmitter antenna 140 may be shielded approximately 315 degrees with the directional shield 148, formed from aluminum and copper, leaving a two-inch opening. Terminal A of the transmitter antenna 140 is switched to ground through the SCR 114. The SCR 114 is "fired" by the output of the 555 timer. This particular configuration generates a narrow pulsed waveform to the transmitter antenna 140 at a pulse rate as set by the 555 timer. Power is delivered through the 3 W resistor. Frequencies down to 4 Hz are achieved by an RC network containing a 100 K pot, a switch, and one of two capacitive paths. The circuit 108 may provide simple RC-controlled timing and deliver pulses to the primary of a step-up transformer 116, the output of which is full-wave rectified and fed to the transmitter antenna 140. The pulse rate is adjustable from the low Hz range to the low kHz range. The sharp pulses at low repetition frequencies yield a wide spectrum of closely spaced lines. The pulse rate is adjusted depending on the material to be detected. In some embodiments, one or more portions of the transmitter unit 106 may be implemented in an analog circuit configuration, a digital circuit configuration, or some combination thereof. In one example, the analog configuration may include one or more analog circuit components, such as, but not limited to, operational amplifiers, op-amps, resistors, inductors, and capacitors. In another example, the digital configuration may include one or more digital circuit components, such as, but not limited to, microprocessors, logic gates, and transistor-based switches. In some instances, a given logic gate may include one or more electronically controlled switches, such as transistors, and the output of a first logic gate may control one or more logic gates disposed "downstream" from the first logic gate.

Further, embodiments may include a circuit 108, which may be an assembly of electronic components that generate, modulate, and transmit radio frequency, RF, signals. The circuit 108 may include oscillators 110, amplifiers, modulators, and other components that work together to produce a specific RF signal, which can then be transmitted through the transmitter antenna 140. The circuit 108 may include an oscillator 110, which generates a stable RF signal at a specified frequency. This frequency is selected based on the resonance characteristics of the target material. For example, the system may operate at 180 Hz or 1800 Hz, depending on the specific detection task. Once generated, the RF signal is fed into an amplifier. The amplifier boosts the signal strength to a level suitable for transmission over the desired distance. This provides that the signal can propagate through various media and reach the receiver unit 122 effectively. Modulation circuits are used to encode information into the RF signal. This may involve varying the amplitude, frequency, or phase of the signal to carry specific data related to the detection process. Modulation provides that the transmitted signal can be uniquely identified and distinguished from other signals in the environment. The circuit 108 may include power control components that regulate the voltage and current supplied to the oscillator 110 and amplifier. This provides consistent signal output and helps in managing the power consumption of the device. In some embodiments, the transmitter unit 106 may operate at voltages such as 160V and 320V, with adjustments made to optimize detection performance. The amplified and modulated RF signal is then routed to the transmitter antenna 140. The transmitter antenna 140 converts the electrical signal into an electromagnetic wave that can propagate through the air or other media. In some embodiments, the circuit 108 may be integrated with the device's control systems, allowing for automated adjustments based on pre-set parameters or operator inputs.

Further, embodiments may include a tunable oscillator 110, which may be a type of electronic component that generates a periodic waveform with a frequency that can be adjusted or tuned over a specific range. The tunable oscillator 110 within the transmitter unit 106 may be utilized to generate the RF signal that will be transmitted by the RF detection system 102. The tunable oscillator 110 in the transmitter unit 106 may be employed to produce an RF signal whose frequency can be precisely controlled. By adjusting the control inputs, the frequency of the output signal can be varied, allowing the system to adapt to different detection scenarios and environmental conditions. This tuning mechanism may provide that the oscillator 110 produces a signal at the correct frequency for effective resonance with the target materials. By tuning the oscillator 110 to specific frequencies, the system may detect various substances based on their unique resonant properties. The tunable oscillator 110 may work in conjunction with the control panel 152, which sends control signals to adjust the oscillator's 110 frequency as desired. The tunable oscillator 110 may act as the core signal generation component in the transmitter unit 106. When the control panel 152 determines the frequency for detection, it sends control signals to the tunable oscillator 110. The oscillator 110 then adjusts its frequency accordingly, generating an RF signal that matches the desired parameters. The tunable oscillator 110 may be connected to other components within the transmitter unit 106, such as the SCR 114 and the transformer 116. The SCR 114 manages the power supply to the oscillator 110, ensuring it receives the correct voltage. The transformer 116 steps up the voltage to the appropriate level for the oscillator 110.

Further, embodiments may include an NPN transistor 112, which may be a type of bipolar junction transistor, BJT, that includes three layers of semiconductor material: a layer of p-type material, the base layer, sandwiched between two layers of n-type material, the emitter and the collector. When a small current flows into the base, it allows a larger current to flow from the collector to the emitter, effectively acting as a current amplifier or switch in electronic circuits. The NPN transistor 112 in the transmitter unit 106 amplifies the RF signal generated by the oscillator 110. The NPN transistor 112 may operate in its active region, where a small input current applied to the base controls a larger current flowing from the collector to the emitter. This amplification process provides that the RF signal reaches a sufficient power level for effective transmission. In some embodiments, the NPN transistor 112 may also function as a switch, controlling the flow of current within the circuit 108. When the base-emitter junction is forward-biased, a small voltage is applied, and the NPN transistor 112 allows current to flow from the collector to the emitter. This switching action is used to modulate the RF signal, encoding information onto the carrier wave for the detection process. Proper biasing of the NPN transistor 112 is useful for stable operation. In some embodiments, resistors may be used to establish the correct biasing conditions to provide that the NPN transistor 112 operates in its linear region for amplification or in saturation/cutoff regions for switching. The biasing circuit provides that the NPN transistor 112 responds predictably to input signals, maintaining signal integrity. In some embodiments, the NPN transistor 112 may be involved in modulating the RF signal. By varying the input current to the base, the amplitude, frequency, or phase of the RF signal can be modulated. This modulation is useful for encoding the detection data onto the transmitted signal, allowing for accurate identification and analysis. In some embodiments, the NPN transistor 112 may be integrated into the broader transmitter circuit 108, working in conjunction with other components such as capacitors, inductors, and resistors. This integration provides that the NPN transistor's 112 amplification and switching actions are synchronized with the overall signal generation and transmission process. The circuit 108 design may leverage the NPN transistor's 112 properties to achieve the desired RF output characteristics.

Further, embodiments may include an SCR 114, or silicon-controlled rectifier, which may be a type of semiconductor device that functions as a switch and rectifier, allowing current to flow only when a control voltage is applied to its gate terminal. The SCR 114 is utilized within the transmitter unit 106 to manage and control the power delivery to the RF signal generation components. The SCR 114 in the transmitter unit 106 may be employed to control the flow of power to the RF oscillator 110 circuit 108. By applying a gate signal to the SCR 114, it switches from a non-conductive state to a conductive state, allowing current to pass through and power the oscillator 110. This control mechanism provides that the oscillator 110 only receives power when desired, thereby conserving energy and preventing unnecessary power dissipation. The SCR 114 may act as a switching element in the transmitter unit 106. When the control panel 152 determines that the RF signal is to be generated, a gate voltage is applied to the SCR 114. This triggers the SCR 114 to conduct, completing the circuit and enabling current to flow to the RF oscillator 110. The SCR 114 may provide that sufficient current is supplied to the oscillator 110 to produce a strong RF signal without being damaged by the high power levels. The gate terminal of the SCR 114 may be connected to the control panel 152, which manages the timing and application of the gate signal. This integration provides that the SCR 114 is activated when the RF signal is to be transmitted, in sync with the overall operation of the RF detection device 102. The control panel 152 sends the appropriate signal to the SCR 114, ensuring accurate timing and efficient power usage. The SCR 114 may also serve as a protective component in the transmitter unit 106. By controlling the power flow prevents overloading and potential damage to the RF oscillator 110 and other sensitive components. If the system detects any abnormal conditions, the control panel 152 can withhold the gate signal, keeping the SCR 114 in a non-conductive state and thereby cutting off power to protect the circuit 108.

Further, embodiments may include a transformer 116, which is an electrical device that transfers electrical energy between two or more circuits through electromagnetic induction. The transformer 116 is utilized within the transmitter unit 106 to manage and control the voltage levels for the RF signal generation and transmission. The transformer 116 in the transmitter unit 106 may be employed to step up or down the voltage as desired to achieve the proper operation of the RF oscillator 110 circuit 108. By adjusting the voltage levels, the transformer 116 provides that the components within the transmitter unit 106 receive the appropriate voltage for efficient functioning. The transformer 116 may act as a voltage regulation element in the transmitter unit 106. When the control panel 152 determines that the RF signal is to be generated, the transformer 116 adjusts the input voltage to the desired level. This adjustment involves converting the primary winding voltage to a higher or lower voltage in the secondary winding, depending on the RF oscillator 110. The transformer 116 provides that the oscillator 110 receives a stable and appropriate voltage, which is useful for producing a consistent and strong RF signal. The primary winding of the transformer 116 may be connected to the battery 120, while the secondary winding is connected to the RF oscillator 110 circuit 108. This integration provides that the transformer 116 can effectively manage the voltage levels for RF signal generation. The control panel 152 monitors and regulates the input voltage to the transformer 116, providing accurate and efficient voltage conversion and delivery to the RF oscillator 110.

Further, embodiments may include a bridge rectifier 118, which is an electrical device designed to convert alternating current, AC, to direct current, DC, using a combination of four diodes arranged in a bridge configuration. The bridge rectifier 118 is utilized within the transmitter unit 106 to provide that the RF signal generation components receive a steady and reliable DC power supply. The bridge rectifier 118 in the transmitter unit 106 may be employed to convert the incoming AC voltage from the battery 120 into a DC voltage. By using all or most portions of the AC waveform, the bridge rectifier 118 provides full-wave rectification or close to full-wave rectification, resulting in a more efficient conversion process and producing a smoother and more stable DC output. The bridge rectifier 118 may act as a power conversion element in the transmitter unit 106. When the control panel 152 determines that the RF signal is to be generated, the AC voltage supplied to the transmitter unit 106 is passed through the bridge rectifier 118. The bridge rectifier 118 converts the AC voltage into a DC voltage by directing the positive and negative halves of the AC waveform through the appropriate diodes. This process results in a continuous DC voltage output that is used to power the RF oscillator 110 and other components. The input terminals of the bridge rectifier 118 may be connected to an AC power supply, while the output terminals provide the rectified DC voltage to the RF oscillator 110 circuit 108. This integration provides that the bridge rectifier 118 can effectively convert and deliver the DC power for RF signal generation. The control panel 152 monitors the output of the bridge rectifier 118, ensuring that the DC voltage is stable and within the desired range for optimal performance.

Further, embodiments may include a battery 120, which may be a type of energy storage device that provides a stable and portable power source for the transmitter unit 106. The battery 120 within the transmitter unit 106 may be utilized to supply electrical energy to the various components involved in generating and transmitting the RF signal. The battery 120 may be designed to store electrical energy and supply it to the respective components as desired. The battery 120 may be rechargeable or replaceable cells capable of providing DC voltage. They are selected based on factors such as voltage output and capacity, which may be measured in ampere-hours, Ah, and size to meet the power specifications of each component effectively. In the transmitter unit 106, battery 120 may serve as a portable power source, enabling the generation and transmission of RF signals without requiring a direct connection to an external power supply. The battery 120 may power components such as the oscillator 110 circuit 108, SCR 114, and transformer 116, ensuring continuous operation in various environmental conditions. In some embodiments, the battery 120 used may include lithium-ion, nickel-metal hydride, or other types suitable for portable electronic devices.

Further, embodiments may include a receiver unit 122, which may include the electronic circuit 124. Voltage from the receiver antenna 142 passes through a 10 K gain pot to an NPN transistor 126 used as a common emitter. The output is capacitively coupled to a PNP Darlington transistor 128. A plurality of resistors and capacitors fills in the circuit 124. The output is fed through an RPN 130 to a 555 timer that is used as a voltage-controlled oscillator. A received signal of a given amplitude generates an audible tone at a given frequency. In some embodiments, the output is fed to a tone generator 132, such as a speaker, via a standard 386 audio amp. Sounds can be categorized as "grunts," "whines," and a particular form of whine with a higher harmonic notably present. In some embodiments, another indicator of a received signal is used, such as light, vibration, digital display, or analog display, in alternative to or in combination with the sound signal. A battery 136 may be used to power the receiver circuit 124. The receiver circuit 124 may utilize a coherent, direct-conversion mixer, homodyne, with RF gain, yielding a baseband signal centered about DC. After a baseband gain stage, the baseband signal is fed to another timing circuit that functions as a voltage-controlled audio-frequency oscillator. The output of this oscillator is amplified and fed to a speaker. In some embodiments, one or more portions of the receiver unit 122 may be implemented in an analog circuit configuration, a digital circuit configuration, or some combination thereof. In one example, the analog configuration may include one or more analog circuit components, such as, but not limited to, operational amplifiers 134, op-amps, resistors, inductors, and capacitors. In another example, the digital configuration may include one or more digital circuit components, such as, but not limited to, microprocessors, logic gates, and transistor-based switches. In some instances, a given logic gate may include one or more electronically controlled switches, such as transistors, and the output of a first logic gate may control one or more logic gates disposed "downstream" from the first logic gate.

Further, embodiments may include a circuit 124 within the receiver unit 122, which may be an assembly of electrical components designed to process the received RF signal. The circuit 124 may accurately interpret the RF signals responded or emitted from the target substances and convert them into data that can be analyzed by the RF detection device 102. The circuit 124 in the receiver unit 122 may be employed to handle signal amplification, filtering, demodulation, and signal processing. When an RF signal is received via the receiver antenna 142, it is typically weak and may contain noise or interference. The first stage of the circuit 124 may involve an amplifier that boosts the signal strength to a level suitable for further processing. This amplification provides that even weak signals can be analyzed effectively. Next, the circuit 124 may include filtering components that serve to remove unwanted frequencies and noise from the received signal. Filters provide that only the relevant frequency components of the RF signal are passed through, enhancing the signal-to-noise ratio and improving the clarity of the data. The circuit 124 may also incorporate a demodulator, which extracts the original information-bearing signal from the modulated RF carrier wave. This step interprets the data encoded in the RF signal, allowing the system to identify specific characteristics or signatures of the target substances. In some embodiments, the circuit 124 may include various signal processing components, such as analog-to-digital converters, ADCs, which convert the analog RF signal into digital data. This digital data may then be processed by the control panel 152 or other computational units within the system for detailed analysis. The signal processing may involve algorithms to detect specific patterns, frequencies, or anomalies that indicate the presence of target materials. The components within the circuit 124 interact seamlessly to achieve accurate and efficient signal processing. For example, the amplified signal from the amplifier is passed to the filter, which cleans up the signal before it reaches the demodulator. The demodulated signal is then digitized by the ADC and sent to the control panel 152 for analysis.

Further, embodiments may include an NPN transistor 126, which may be a three-terminal semiconductor device used for amplification and switching of electrical signals. The NPN transistor 126 may include three layers of semiconductor material: a thin middle layer, or base, between two heavily doped layers, or emitter and collector. The NPN transistor 126 operates by controlling the flow of current from the collector to the emitter, regulated by the voltage applied to the base terminal. The NPN transistor 126 integrated into the receiver unit 122 may be designed to process incoming RF signals and may operate in a configuration where the base-emitter junction is forward-biased by a small control voltage, provided by preceding stages of the circuit 124. The collector of the NPN transistor 126 may be connected to the circuit's 128 supply voltage through a load resistor. When a small current flows into the base terminal, it allows a larger current to flow from the collector to the emitter. This amplification process increases the strength of the received signal, enabling subsequent stages of the circuit 124 to process it more effectively. In the receiver unit 122, the NPN transistor 126 may be employed within amplifier stages where signal gain is desirable. By controlling the base current, the circuit 124 can modulate the NPN transistor's 130 conductivity and thereby regulate the amplification factor. This capability enhances weak RF signals received by the receiver antenna 142 and prepares them for further processing. In some embodiments, the NPN transistor 126 may be utilized in conjunction with capacitors and resistors to form amplifier circuits tailored to the specific RF detection device 102. Capacitors may be used to couple AC signals while blocking DC components, ensuring that only the RF signal is amplified. Resistors set the biasing and operating points of the transistor, optimizing its performance within the circuit 124.

Further, embodiments may include a PNP Darlington transistor 128, which may be a semiconductor device including two PNP transistors connected in a configuration that provides high current gain. The PNP Darlington transistor 128 integrates two stages of amplification in a single package, where the output of the first transistor acts as the input to the second, significantly boosting the overall gain of the circuit 124. The PNP Darlington transistor 128 amplifies weak RF signals received by the receiver antenna 142. The incoming RF signal is fed into the base of the first PNP transistor 128 within the Darlington pair. The PNP Darlington transistor 128, due to its high current gain, allows a much larger current to flow from its collector to the emitter compared to the base current. The output from the collector of the first transistor serves as the input to the base of the second PNP transistor 128 in the Darlington pair. The second PNP transistor 128 further amplifies the signal received from the first stage, again with significant current gain.

Further, embodiments may include an RPN 130, or resistor potentiometer network, which may be an electrical circuit composed of resistors and potentiometers interconnected in a specific configuration to achieve desired electrical characteristics, such as voltage division, signal attenuation, or adjustment of resistance values. Potentiometers, also known as variable resistors, allow for manual adjustment of resistance within the circuit, while resistors set fixed values to control current flow and voltage levels. The RPN 130 in the receiver unit 122 may be configured to adjust signal levels received from the receiver antenna 142 and prepare them for further processing. The RPN 130 includes resistors and potentiometers connected to achieve precise voltage division and attenuation. By adjusting the potentiometers, operators can fine-tune the signal strength and impedance matching, optimizing signal quality for subsequent stages of signal processing. The RPN 130 provides that incoming RF signals from the receiver antenna 142 are properly attenuated and scaled to match the input specifications of downstream electronics. This calibration process maintains signal integrity and fidelity throughout the reception and decoding process. In some embodiments, the potentiometers within the RPN 130 may allow for manual adjustment of signal parameters such as amplitude and impedance, enabling operators to improve or optimize signal reception based on environmental and operational conditions.

Further, embodiments may include a tone generator 132, which may be a type of electronic device that produces audio signals or tones to alert the user of specific conditions. The tone generator 132 within the receiver unit 122 is utilized to generate audible alerts when the RF detection device 102 identifies the presence of target materials. The tone generator 132 in the receiver unit 122 may be employed to create specific tones that serve as audible indicators for the user. By generating these tones, the tone generator 132 provides immediate feedback to the operator, signaling the detection of target materials in real time. The tone generator 132 may provide that the operator is promptly informed of detections without constantly monitoring visual displays. The tone generator 132 produces distinct sounds that correspond to different detection events, making it easier for the operator to understand the system's status and respond accordingly. The tone generator 132 may act as an alerting component within the receiver unit 122. When the control panel 152 determines that the RF signal corresponds to a detected target material, it sends a signal to the tone generator 132. This triggers the tone generator 132 to produce a sound, alerting the operator to the detection event.

Further, embodiments may include an audio amplifier 134, which may be a type of electronic device designed to increase the amplitude of audio signals. The audio amplifier 134 within the receiver unit 122 may be utilized to boost the audio signals generated by the tone generator 132, ensuring that the output sound is sufficiently loud and clear for the operator to hear. The audio amplifier 134 in the receiver unit 122 may be employed to enhance the volume and clarity of the audio tones produced by the tone generator 132. By amplifying these audio signals, the audio amplifier 134 provides that the operator receives audible alerts even in noisy environments, thus improving the overall effectiveness of the detection system. The audio amplifier 134 may act as an intermediary component between the tone generator 132 and the output device, such as a speaker. When the tone generator 132 produces an audio signal, this signal is sent to the audio amplifier 134. The audio amplifier 134 then boosts the signal's power, making it strong enough to drive the speaker and produce an audible sound. The audio amplifier 134 is connected to other components within the receiver unit 122, including the tone generator 132 and the speaker. It receives the low-power audio signals from the tone generator 132 and amplifies them to a level suitable for driving the speaker.

Further, embodiments may include a battery 136, which may be a type of energy storage device that provides a stable and portable power source for the receiver unit 122. The battery 136 within the receiver unit 122 may be utilized to supply electrical energy to the various components involved in generating and transmitting the RF signal. The battery 136 may be designed to store electrical energy and supply it to the respective components as desired. The battery 136 may be rechargeable or replaceable cells capable of providing DC voltage. They are selected based on factors such as voltage output, and capacity, which may be measured in ampere-hours, Ah, and size to meet the power specifications of each component effectively. In the receiver unit 122, batteries 136 may provide electrical energy to receive and process RF signals detected by the receiver antenna 142. The battery 136 may power components such as amplifiers 134, filters, and signal processing circuitry, enabling the device to analyze incoming RF signals and extract relevant information. In some embodiments, the battery 136 may include lithium-ion, nickel-metal hydride, or other types suitable for portable electronic devices.

Further, embodiments may include a gimbal 138, which may be a pivoted support that allows the rotation of an object about a single axis or multiple axes, providing stabilization and precise control of its orientation. The gimbal 138 for the RF detection device 102 may include three rotational axes: pitch, yaw, and roll, which enable the attached transmitter antenna 140, receiver antenna 142, and sensors to maintain a specific orientation regardless of the movement of the support frame or external disturbances. In some embodiments, the gimbal 138 may include position detection sensor 146 such as encoders, gyroscopes, and accelerometers to continuously monitor and adjust the orientation of the device, ensuring accurate and stable pointing in the desired direction. In some embodiments, the gimbal 138 may be mounted within a stationary support frame 104 and may be attached via a commutator 144, which maintains electrical connections while allowing for rotational movement. In some embodiments, encoders may provide precise angular position feedback for each axis. In some embodiments, gyroscopes and accelerometers may measure orientation and movement, assisting in stabilization and providing additional data on the gimbal's 138 position. In some embodiments, servo motors may be used for precise control of the gimbal's 138 movements and provide accurate positioning. In some embodiments, stepper motors may be used for incremental movements. In some embodiments, the gimbal 138 may include a control system that may use microcontrollers or microprocessors to manage the movement of the gimbal 138 based on input from the control panel 152 and feedback from the sensors 146. In some embodiments, the gimbal 138 may include control algorithms that are implemented to achieve smooth and accurate movements, including PID or Proportional-Integral-Derivative, control loops. In some embodiments, in a medical environment, such as cancer screening, a gimbal 138 could be used to precisely control and orient the transmitter antenna 140 and receiver antenna 142 around a patient's body. The gimbal 138 may allow the antennas to move smoothly and accurately over the target area, maintaining the correct orientation to detect RF signals indicative of cancerous tissues. The position detection sensors 146 in the gimbal 138 may provide that the scanning is thorough and covers desired angles, providing comprehensive data to medical professionals or other users. This precise control and movement are useful in identifying the exact location and boundaries of tumors, thereby improving diagnostic accuracy and aiding in effective treatment planning. In some embodiments, for security purposes, such as screening vehicles at a military base or luggage at airports, the gimbal 138 may provide precise control and orientation of the transmitter antenna 140 and receiver antenna 142. Mounted on a stationary support frame, the gimbal 138 may enable the antennas to rotate and tilt to scan the entire surface of a vehicle or luggage item. The position detection sensors 146 may provide that most or every part of the target is scanned accurately, detecting any hidden threats or contraband. The ability to maintain a stable and precise orientation while scanning various angles may enhance the effectiveness of the security screening process, ensuring that no area is missed and that potential threats are identified quickly and accurately.

Further, embodiments may include a transmitter antenna 140, which may be a device that radiates radio frequency, RF, signals generated by the transmitter unit 106 towards a target material. The transmitter antenna 140 may be designed to efficiently transmit the generated RF signals into the surrounding environment and to provide the signals reach the intended target with minimal loss. The transmitter antenna 140 may be responsible for the emission of RF signals for detecting materials at a distance. In some embodiments, the transmitter antenna 140 may operate within a specific frequency range suitable for detecting the atomic structures and characteristics of the target materials. The frequency range may be determined by the system's specifications and the properties of the materials being detected. In some embodiments, the gain of the transmitter antenna 140 may be a measure of its ability to direct the RF energy toward the target. Higher gain antennas focus the energy more effectively, resulting in stronger signal transmission over longer distances. The transmitter antenna 140 gain may be optimized for the operational frequency range. In some embodiments, the radiation pattern of the transmitter antenna 140 describes the distribution of radiated energy in space. For effective material detection, the transmitter antenna 140 may have a directional radiation pattern, concentrating the RF energy in a specific direction to enhance detection accuracy. In some embodiments, impedance matching between the transmitter antenna 140 and the transmitter unit 106 may maximize power transfer and minimize signal reflection. Proper impedance matching may achieve efficient operation and reduce losses in the transmission path. In some embodiments, the physical design of the transmitter antenna 140 may include configurations such as dipole, patch, or horn antennas, depending on factors such as frequency range, gain, and environmental conditions. In some embodiments, the transmitter antenna 140 may be integrated with the transmitter unit 106 and other system components through connectors and mounting structures to achieve stable and reliable operation, with considerations for minimizing interference and signal loss.

Further, embodiments may include a receiver antenna 142, which may be a device that captures the radio frequency, RF, signals reflected from a target material. The receiver antenna 142 may be designed to efficiently receive the reflected RF signals and transmit them to the receiver unit 122 for further processing and analysis. The receiver antenna 142 may be responsible for capturing the RF signals that have interacted with the target material. In some embodiments, the receiver antenna 142 may be designed to operate within the same frequency range as the transmitter antenna 140 to achieve compatibility and optimal performance for detecting the atomic structures and characteristics of the target materials. In some embodiments, the sensitivity may be a measurement of the receiver antenna's 142 ability to detect weak signals. A highly sensitive receiver antenna 142 may detect low-power reflected signals, enhancing the system's detection capabilities. In some embodiments, the noise figure of the receiver antenna 142 may indicate the level of noise it introduces into the received signal. A lower noise figure may be desirable as it provides that the captured signals are as clean and strong as possible for accurate processing. In some embodiments, proper impedance matching between the receiver antenna 142 and the receiver unit 122 may minimize signal reflection and maximize the power transfer from the antenna to the processing unit to achieve efficient and accurate signal reception. In some embodiments, the directional properties of the receiver antenna 142 may determine its ability to capture signals from specific directions to distinguish signals reflected from the target material versus other sources of interference. In some embodiments, the gain of the receiver antenna 142 may enhance its ability to receive signals from distant targets. Higher gain antennas can improve the system's ability to detect materials at greater distances. In some embodiments, the physical design of the receiver antenna 142 may include various configurations such as dipole, patch, or parabolic antennas and may be based on factors such as frequency range, gain, and the specific detection scenario. In some embodiments, the receiver antenna 142 may be integrated with the receiver unit 122 and other system components through connectors and mounting structures to achieve stable and reliable operation, with considerations for minimizing interference and signal loss. In some embodiments, the receiver antenna 142 and the transmitter antenna 140 may be a single antenna used by the RF detection device 102.

Further, embodiments may include a commutator 144, which may maintain continuous electrical connections between stationary and rotating parts, enabling the transmission of power and data without interruption as the gimbal 138 moves. In some embodiments, the commutator 144 may include brushes that are stationary conductive elements that make contact with the rotating slip rings. The brushes may be made from carbon or graphite and may be designed to conduct electricity while allowing for rotational movement. In some embodiments, the commutator 144 may include slip rings, which are conductive rings attached to the rotating part of the gimbal 138. As the gimbal 138 rotates, the slip rings maintain contact with the brushes, ensuring a continuous electrical path. In some embodiments, the commutator 144 may be housed within a protective casing that is integrated into the support frame 104. The casing provides that the brushes remain in contact with the slip rings despite the movement and vibrations of the gimbal 138. In some embodiments, the support structure may also include mechanisms to hold the brushes in place and apply consistent pressure to maintain good electrical contact. In some embodiments, the commutator 144 may provide a path for electrical power to reach the gimbal's 138 motors, allowing for precise control of the gimbal's 138 movements. In some embodiments, the commutator 144 may transmit data signals between the gimbal 138 mounted sensors and antennas and the stationary control panel 152, including real-time feedback from position sensors and control signals. For example, when the gimbal 138 rotates, the slip rings turn along with it, while the brushes remain stationary. The brushes, pressed against the slip rings, conduct electricity and maintain an uninterrupted electrical connection. This setup allows the gimbal 138 to rotate freely around its axes without tangling or breaking the electrical wires.

Further, embodiments may include position detection sensors 146, which may be devices that determine the precise location, orientation, or movement of an object within a defined space. The position detection sensors 146 may provide real-time feedback on the object's position, which can include linear displacement, angular orientation, or rotational movement. The position detection sensors 146 may track the angles and orientation of the gimbal's 138 axes, enabling accurate control and positioning of the transmitter antennas 140, receiver antenna 142, and other components. In some embodiments, the position detection sensors 146 may include rotary encoders that measure the rotational position of a shaft or axis. The rotary encoders may be either incremental, providing relative position data, or absolute, providing exact position data within a full rotation. Rotary encoders may be used in gimbals 138 to track the angular position of each axis, such as yaw, pitch, and roll). In some embodiments, the position detection sensors 146 may include linear encoders, which may measure the linear displacement of an object. In some embodiments, the position detection sensors 146 may include gyroscopes, such as micro-electro-mechanical systems gyroscopes, which measure the rate of rotation around an axis. They provide data on how fast the gimbal 138 is rotating, which may be integrated over time to determine angular position. In some embodiments, gyroscopes may be used in conjunction with accelerometers in Inertial Measurement Units or IMUs. In some embodiments, the position detection sensors 146 may include accelerometers that measure acceleration along one or more axes, and when combined with gyroscopes in an IMU, they may determine the orientation and movement of the gimbal. In some embodiments, the position detection sensors 146 may include digital compasses that measure the direction and strength of the Earth's magnetic field, providing absolute orientation data relative to magnetic north. In some embodiments, the position detection sensors 146 may include potentiometers, which may measure the angular position of a rotating shaft by converting the angle into a variable resistance. In some embodiments, the data collected by the position detection sensors 146 may produce analog signals that may be converted to digital for processing. In some embodiments, sensor fusion algorithms may be used to combine the data from gyroscopes, accelerometers, and magnetometers to provide accurate position and orientation information. In some embodiments, in a cancer screening system, position detection sensors 146 may provide that the gimbal 138 can move the device around the patient allowing for detailed mapping of tumors, aiding in accurate diagnosis. In some embodiments, for vehicle screening, position detection sensors 146 enable the gimbal 138 to maneuver the device around the vehicle, ensuring comprehensive inspection.

Further, embodiments may include a directional shield 148, which may be a physical barrier or enclosure designed to direct or block electromagnetic radiation in a specific direction. The directional shield 148 may be constructed from conductive materials such as metal to attenuate RF signals, thereby controlling the propagation of electromagnetic waves. The directional shield 148 may be positioned around the RF oscillator 110 and transmitter antenna 140 components and may act as a physical barrier that prevents RF signals from propagating in undesired directions, thereby enhancing the precision and accuracy of signal transmission and reception. During operation, when the transmitter unit 106 generates an RF signal, the directional shield 148 helps to focus and channel this signal toward the intended detection area. By reducing signal dispersion, the directional shield 148 improves the efficiency of signal transmission and enhances the system's overall sensitivity to detecting RF responses from underground objects or materials.

Further, embodiments may include a power supply 150, such as batteries serving as the power source for specific components within the RF detection device 102, including the control panel 152. This power supply 150 may be designed to store electrical energy and supply it to the respective components as desired. The power supply 150 for the control panel 152 may be rechargeable or replaceable cells capable of providing DC voltage. The power supply 150 may be selected based on factors such as voltage output, and capacity, which may be measured in ampere-hours, Ah, and size to meet the power specifications of each component effectively. In some embodiments, the control panel 152 may rely on the power supply 150 to maintain functionality for user interface operations, data processing, and communication with other parts of the RF detection device 102. The power supply 150 in the control panel 152 may provide that it remains operational during field use, supporting tasks such as signal monitoring, parameter adjustment, and data transmission. In some embodiments, the power supply 150 used in these components may include lithium-ion, nickel-metal hydride, or other types suitable for portable electronic devices. The power supply 150 may be integrated into the design to provide sufficient power capacity and longevity, allowing the RF detection device 102 to operate autonomously for extended periods between recharges or replacements.

Further, embodiments may include a control panel 152, which may be a centralized interface including electronic controls and displays. The control panel 152 may serve as the user-accessible interface for configuring, monitoring, and managing the RF detection device's 102 operational parameters and data output. In some embodiments, the control panel 152 may be designed to provide operators with intuitive access to control and monitor various aspects of the RF detection device 102. The control panel 152 may allow for the configuration of settings such as signal frequency, transmission power, receiver sensitivity, and signal processing algorithms. In some embodiments, operators may use the control panel 152 to initiate and terminate detection operations, adjust calibration settings, and troubleshoot operational issues. In some embodiments, the control panel 152 may include a graphical display screen or LED indicators to present real-time status information and measurement results. In some embodiments, input controls such as buttons, knobs, or touch-sensitive panels may enable operators to interact with the device, input commands, and navigate through menu options. The control panel 152 may interface directly with the internal electronics of the RF detection device 102, including the transmitter unit 106, receiver unit 122, transmitter antenna 140, receiver antenna 142, and signal processing circuitry. Through electronic connections and communication protocols, the control panel 152 may send commands to adjust operational parameters and receive feedback and status updates from the RF detection device 102. In some embodiments, the control panel 152 may be mounted on the support frame 104 and may provide an operator with control of the RF detection device 102, including adjusting various settings and signaling the operator of a detected material. In some embodiments, a rechargeable power supply 150 may power the RF detection device 102, including the transmitter unit 106, the receiver unit 122, and the control panel 152. In some embodiments, multiple batteries may be used. In some embodiments, a tone generator 132, such as a speaker, may be mounted to the support frame 104 to provide audible signals to the operator for detecting target materials.

Further, embodiments may include a communication interface 154, which may be a hardware and software solution that enables data exchange between different systems or components within a network. The communication interface 154 may act as a bridge, facilitating the transfer of information by converting data into a format that can be transmitted and received by different devices. In some embodiments, the communication interface 154 may support various protocols and standards, such as Ethernet, Wi-Fi, Bluetooth, USB, and others, depending on the application. For example, an Ethernet interface may be used for wired network connections, providing reliable and high-speed data transfer. In some embodiments, a Wi-Fi interface may enable wireless connectivity, allowing the device to communicate with remote servers, mobile devices, or cloud-based applications without physical cables. In some embodiments, Bluetooth and USB interfaces may also be included for short-range wireless communication and direct data transfer, respectively. The communication interface 154 may transmit the processed data from the DSP to external systems for further analysis, reporting, or storage. After the DSP processes the signals received from the ADC and extracts meaningful information about the target materials, the control panel 152 may package this data into suitable formats, such as JSON or XML. The communication interface 154 may then send this data over the network to a remote server or database, where it can be accessed by operators, analysts, or automated systems for further decision-making. In some embodiments, the communication interface 154 may provide remote monitoring and control of the RF detection device 102. Operators may use a web-based interface or a mobile application to access real-time status updates, view detection logs, and adjust configuration settings. For example, if the RF detection device 102 is to be calibrated for a new target material, the configuration updates can be sent remotely through the communication interface 154, minimizing on-site adjustments. In some embodiments, the communication interface 154 may support alerting and notification functionalities. When the control panel 152 detects the presence of hazardous materials, it can use the communication interface 154 to send immediate alerts to designated personnel via email, SMS, or push notifications.

Further, embodiments may include a memory 156, which may include suitable logic, circuitry, and/or interfaces that may be configured to store a machine code and/or a computer program with at least one code section executable by the processor 158. Examples of implementation of the memory 156 may include, but are not limited to, fixed (hard) drives, magnetic tape, floppy diskettes, optical disks, Compact Disc Read-Only Memories (CD-ROMs), and magneto-optical disks, semiconductor memories, such as ROMs, Random Access Memories (RAMs), Programmable Read-Only Memories (PROMs), Erasable PROMs (EPROMs), Electrically Erasable PROMs (EEPROMs), flash memory, magnetic or optical cards, or other type of media/machine-readable medium suitable for storing electronic instructions. In some embodiments, the memory 156 may store configuration settings, signal patterns, and detection algorithms.

Further, embodiments may include a processor 158, which may be responsible for executing instructions from programs and controlling the operation of other hardware components. The processor 158 may perform basic arithmetic, logic, control, and input/output (I/O) operations specified by the instructions in the programs. The processor 158 may operate by fetching instructions from memory 156, decoding them to determine the operation, executing the operations, and then storing the results. In some embodiments, the processor 158 may coordinate the overall system operations, manage communication between subsystems, and handle complex data analysis tasks that complement the real-time signal processing performed by the DSP. For example, when the RF detection device 102 is powered on, the processor 158 may initiate a boot-up sequence that includes running diagnostics to check the status of all subsystems, such as the transmitter unit 106, receiver unit 122, and control panel 152. During this initialization phase, the processor 158 may provide that each component receives the correct voltage and current levels desired for operation. The processor 158 may also load predefined detection configurations and communicate with the transmitter unit 106 and receiver unit 122 to configure their operating parameters based on the target material. In some embodiments, the processor 158 may handle user interface tasks, displaying system status indicators and receiving user inputs. The processor 158 may provide that the control panel 152 provides real-time feedback, such as green LED indicators for successful power-up and system readiness. In some embodiments, the processor 158 may manage data storage and logging, recording detection events and system performance metrics for future analysis.

Further, embodiments may include a base module 160, which upon activation of the system, the user inputs the application type and target material into the control panel 152. The base module 160 then compares the target material to entries in the specific material database 168 to identify the relevant frequency data. This frequency data is extracted and sent to the scan module 162. Subsequently, the base module compares the inputted application to the scan database 172 to determine the appropriate scan sequence, which is then extracted and sent to the scan module 162. Finally, the base module 160 initiates the scan module 162, commencing the scanning process according to the defined sequence and frequency parameters. Scan module 162 may be referred to as a gimbal controller.

Further, embodiments may include a scan module 162, which may begin by being initiated by the base module 160 and receive the frequency data and scan sequence data. The scan module 162 then commands the gimbal 138 to position itself according to the first orientation in the scan sequence and sends the frequency data to the detection module 164, which is subsequently activated. The scan module 162 receives detection data from the detection module 164 and stores both the positioning and detection data in the detection database 170. The scan module 162 evaluates whether the target material is detected; if so, it activates the haptic module 166 to provide feedback. Regardless, it checks if additional positions remain in the scan sequence. If more positions are left, the gimbal 138 is commanded to move to the next orientation, and the process repeats. If no positions remain, control is returned to the base module 160.

Further, embodiments may include a detection module 164, which begins by being initiated by the scan module 162. The detection module 164 receives frequency data and detection parameters for identifying the target material based on its unique electromagnetic properties. The detection module 164 commands the transmitter unit 106 to configure and generate the appropriate RF signal, which is then transmitted via the transmitter antenna 140. This signal interacts with the environment and target materials, producing changes detectable by the receiver unit 122. The receiver unit 122 captures and processes these changes, converting the RF signal back into electrical signals, which are then amplified, filtered, and digitized. The processed detection data is sent back to the scan module 162 for storage and further analysis. In some embodiments, if the target material is detected, the detection module 164 may provide feedback and continue scanning until all positions are covered. Finally, the detection module 164 returns control to the scan module.

Further, embodiments may include a haptic module 166, which is initiated if the scan module 162 determines that the target material was detected. The haptic module 166 then activates the haptic apparatus 174 to notify or inform the user of the detection of the target material and returns to the scan module 162.

Further, embodiments may include a specific material database 168, which may store and manage detailed information about various target materials. The specific material database 168 may be used to configure the detection parameters to identify specific materials based on their unique electromagnetic properties. Each entry in the database may be defined by the material's atomic structure, which includes the total number of protons and neutrons. The unique nuclear composition allows each substance to be distinctly identifiable and detectable through its resonant frequency. The specific material database 168 may contain a unique material ID, the common name of the material, the number of protons, the number of neutrons, and the atomic mass, which is the sum of protons and neutrons. The specific material database 168 may also contain calculated resonant frequencies based on the atomic characteristics. The resonant frequencies are useful for configuring the transmitter unit of the RF detection system 102, which sends out signals at these specific frequencies to induce a resonant response in the target material. For example, the specific material database 168 may contain an entry for Arsenic (As) with 33 protons and 42 neutrons, resulting in an atomic mass of 75. As an example, the resonant frequencies for Arsenic could be 33 Hz, based on the number of protons, 42 Hz, based on the number of neutrons, and 75 Hz, based on the atomic mass. These frequencies may also be increased by orders of magnitude, such as 10× or 100×, to suit different detection environments. These frequencies are provided as illustrative examples. The actual frequencies may be determined through experiment or simulation. In some embodiments, for compounds, the specific material database 168 calculates a combined frequency based on the sum of the resonant frequencies of the constituent elements. For example, a formaldehyde molecule composed of 16 protons and 14 neutrons with a total atomic mass of 30 may have corresponding frequencies of 16 Hz, 14 Hz, and 30 Hz, respectively. Another example may be smokeless gunpowder, specifically nitroglycerin, with the chemical composition $CH_2NO_3CHNO_3CH_2NO_3$. The frequency for this compound may be calculated by summing the frequencies based on the atomic numbers of its constituent elements: 6 carbon+ 1×2 hydrogen+7 nitrogen+8×3 oxygen, repeated thrice, resulting in a total of 116 protons. This is then multiplied by 10 to yield a base frequency of 1160 Hz for detection purposes. In some embodiments, the specific material database 168 may account for overlapping frequencies among different elements and compounds. To enhance the accuracy of detection, the system may employ multiple methods to calculate and verify the target material's frequency, such as using combinations of proton counts, neutron counts, and atomic masses, which allows the system to distinguish between materials with similar frequencies by leveraging the unique resonant properties of each substance.

Further, embodiments may include a detection database 170, which may be created in the process described in the scan module 162. The detection database 170 may contain data, such as information on detected target materials, their positions, timestamps, and other relevant metadata. In some embodiments, the detection database 170 may serve as a central repository for all detection events, allowing users to analyze and interpret the findings accurately. In some embodiments, the target material may specify the type of material detected, such as cancerous tissue, explosives, or biohazardous substances. In some embodiments, the detection database 170 may include the material properties, such as density, composition, and any unique signatures that helped in its identification. In some embodiments, the detection database 170 may include the frequency data, signal data, etc., that was used to detect the target material. In some embodiments, the detection database 170 may include positioning data, such as coordinates that provide the exact location of the detected material, such as represented in a 3D coordinate system (X, Y, Z). In some embodiments, the positioning data may include the orientation of the RF detection device 102 at the time of detection, including pitch, yaw, and roll angles. In some embodiments, the positioning data may include the area coverage, such as the spatial extent or volume occupied by the detected material. In some embodiments, the timestamp data may include the date, time, duration of the detection event, etc. In some embodiments, the user may view the data stored in the detection database 170 on the user device 180, which may include analytical tools that allow users to perform statistical analysis, pattern recognition, and other advanced data processing. In some embodiments, the control panel 152 and/or the user device 180 may support visualizations of data through charts, graphs, and 3D models, enabling users to see the spatial distribution of detected materials. For example, the detection database 170 may store detailed information on cancerous tissues detected during patient scans. Medical professionals can query the detection database 170 through the user device 180 to retrieve data on tumor locations, sizes, and properties, along with timestamps for each detection event. In some embodiments, 3D models of the tumor's position within the patient's body may be generated, aiding in diagnosis and treatment planning. For example, the detection database 170 may record instances of detected explosives or contraband in vehicles. Security personnel may access the detection database 170 through the control panel 152 or user device 180 to review detection events, including the specific location and type of detected materials. In some embodiments, visual maps of vehicles with highlighted areas of concern may be generated, facilitating efficient and thorough inspections.

Further, embodiments may include a scan database 172 which may be previously created or previously stored database on the RF detection device 102 that contains predefined scanning patterns and positional data for the gimbal 138. The scan database 172 provides that the gimbal 138 follows specific movements and positions to comprehensively scan an environment or area, depending on the application, such as medical, military, or security. The scan database 172 allows for consistent, repeatable, and thorough coverage of the target area. In some embodiments, the scan database 172 may contain a variety of pre-defined scanning patterns tailored to different applications. The patterns dictate the movements the gimbal 138 follows to achieve sufficient or complete coverage of the environment. In some embodiments, users may define and store custom scan patterns to meet specific scenarios or adjust existing patterns based on operational conditions. In some embodiments, the scan database 172 may contain detailed positional data for each scan pattern, including the specific coordinates (X, Y, Z) the gimbal 138 moves to during the scan. In some embodiments, the scan database 172 may contain information on the orientation (pitch, yaw, roll) of the gimbal 138 at each position to achieve improved or optimal signal detection. In some embodiments, the scan database 172 may contain the sequence of movements and transitions between positions, providing a smooth and efficient scan. For example, for medical applications, scan patterns may be optimized for body scanning, providing thorough coverage of areas of interest, such as organs or tissues. For military applications, scan patterns may be designed for vehicle or area inspections, focusing on identifying hidden or dangerous materials. In some embodiments, the scan database 172 may include the scan duration, which may be the timing information specifying how long the gimbal 138 should remain at each position to take accurate readings. Time intervals between movements may be stored to allow for stable data acquisition and to minimize the impact of vibrations or external disturbances. For example, the scan database 172 contains patterns for scanning specific body parts, such as the liver, lungs, or brain, to detect cancerous tissues. The gimbal 138 follows predefined paths to provide thorough coverage of the target area, with positional data specifying the coordinates and orientation for each scan point.

Further, embodiments may include a haptic apparatus 174, which may be a system or device that provides tactile feedback to a user through the application of forces, vibrations, or motions. The feedback may be designed to simulate the sense of touch, enabling users to feel physical sensations that correspond to interactions with digital or virtual objects. The haptic apparatus 174 may provide real-time tactile feedback to the operator of the RF detection device 102, enhancing the usability and effectiveness of the device by conveying important information through touch. In some embodiments, the feedback may signal various states of the device, such as the detection of a signal, directionality, or proximity to a target. In some embodiments, the haptic apparatus 174 may include vibration motors, such as eccentric rotating mass, which creates vibrations by spinning an off-center weight, or linear resonant actuator, which produces vibrations by moving a mass linearly instead of rotating it. In some embodiments, the haptic apparatus 174 may include piezoelectric actuators, such as piezo buzzers, which use piezoelectric materials to create vibrations or tones when an electric field is applied, or piezo haptic actuators, which create a variety of tactile sensations. In some embodiments, the haptic apparatus 174 may include electroactive polymers, which may be materials that change shape when an electric field is applied, producing a wide range of haptic feedback effects. In some embodiments, the haptic apparatus 174 may include force feedback devices, such as haptic joysticks or levers, which provide resistance or force feedback, simulating the feeling of interacting with physical objects. In some embodiments, the haptic apparatus 174 may include ultrasonic haptics, such as ultrasonic waves, which may create the sensation of touch in mid-air. In some embodiments, vibration motors may be used to indicate the direction in which the RF detection device 102 should be pointed. For example, stronger vibrations on one side of the handle can signal that the operator should move the device in that direction. In some embodiments, the intensity and pattern of vibrations may be varied to indicate the strength of a detected signal. Stronger or more frequent vibrations may denote a stronger signal, helping the operator zero in on the target. In some embodiments, the haptic apparatus 174 may be integrated with the device's control panel 152, providing tactile feedback in response to user inputs or system alerts. In some embodiments, the haptic apparatus 174 may be programmed to deliver specific patterns of vibrations or forces based on different scenarios. For example, a short, sharp buzz may indicate the detection of a signal, while a long, pulsing vibration may signal proximity to a target.

Further, embodiments may include a cloud 176, or communication network, which may be a wired and/or wireless network. The communication network, if wireless, may be implemented using communication techniques such as Visible Light Communication (VLC), Worldwide Interoperability for Microwave Access (WiMAX), Long Term Evolution (LTE), Wireless Local Area Network (WLAN), Infrared (IR) communication, Public Switched Telephone Network (PSTN), Radio waves, and other communication techniques known in the art. The communication network may allow ubiquitous access to shared pools of configurable system resources and higher-level services that can be rapidly provisioned with minimal management effort, often over the Internet, and relies on the sharing of resources to achieve coherence and economies of scale, like a public utility, while third-party clouds 176 enable organizations to focus on their core businesses instead of expending resources on computer infrastructure and maintenance.

Further, embodiments may include a 3rd party network 178, which may be a collection of interconnected devices that communicate with each other to share resources, data, and applications. In some embodiments, the 3rd party network 178 may utilize various protocols, such as TCP/IP, such that data is transmitted accurately and efficiently. In some embodiments, the 3rd party network 178 may transmit the processed data from the DSP to user devices 180, allowing operators to view and analyze the data collected. The 3rd party network 178 may be designed to support real-time data transmission, remote monitoring, and analysis functionalities, ensuring that the system operates efficiently and effectively. Upon receiving the processed signals from the DSP, the control panel 152 may package the data into standardized formats such as JSON or XML, making it suitable for transmission over the 3rd party network 178. In some embodiments, the 3rd party network 178 setup may involve an Ethernet or Wi-Fi interface integrated into the control panel 152, which establishes a connection to the local network or the internet. For example, when the control panel 152 detects the presence of target materials, it sends the relevant data to the server or cloud platform via the 3rd party network 178. The data is then processed and stored, allowing operators to access it through their user devices 180. For example, if the RF detection device 102 identifies a hazardous material, the data is immediately transmitted to the cloud platform, where it triggers alerts and notifications to the operators' devices. Operators can then log into the platform, view detailed reports, and analyze the data to make informed decisions.

Further, embodiments may include a user device 180, which may be an electronic device that provides an interface for users to interact with applications, data, and other digital services. In some embodiments, user devices 180 may include desktop computers, laptops, tablets, and smartphones to specialized equipment like industrial handhelds or medical diagnostic tools. In some embodiments, the user device 180 may include input mechanisms, such as keyboards, touchscreens, etc., and output displays, such as screens, processing capabilities, storage, and connectivity options. The user device 180 may enable operators to view and analyze the data collected by the RF detection device 102. In some embodiments, the user device 180 may act as an interface through which operators receive real-time updates, visualize data, and make informed decisions based on the detected signals. In some embodiments, the user device 180 may connect to the 3rd party network 178, where the RF detection data is stored and processed. For example, the RF detection devices 102 may identify the presence of hazardous materials, and the processed data from the DSP may be transmitted over the 3rd party network 178 to the user device 180, which may be equipped with specialized application software or a web-based interface designed to display the data in a user-friendly and comprehensible format. In some embodiments, the user device 180 may include a high-resolution display screen that presents data visualizations, such as graphs, charts, and maps, allowing operators to quickly interpret the detection results. In some embodiments, the user device 180 may include various connectivity options such as Wi-Fi, Ethernet, Bluetooth, and cellular networks to provide reliable communication with the RF detection devices 102, 3rd party network 178, and remote servers. In some embodiments, the user device 180 may include interactive dashboards, customizable alerts, and detailed logs of detection events. For example, an operator may use the interface to set thresholds for alerts, view historical data trends, and configure the detection parameters remotely.

In another embodiment, the material detection system uses a hybrid antenna that can operate both in RF-based and magnetic-based detection modes. This system is capable of switching between detecting materials based on their interaction with the RF field or the magnetic field, depending on the material being analyzed. In RF mode, the antenna transmits RF waves, and the system analyzes how the material reflects or absorbs these waves, providing information based on the dielectric constant or conductive properties of the material. In magnetic mode, the antenna focuses on the interaction between the material and the magnetic field component of the electromagnetic wave, allowing detection of materials with high magnetic permeability or strong magnetic responses. For example, the system could be used to detect metallic substances or magnetic compounds, such as those found in explosive materials, by optimizing the detection process based on which field interaction yields the clearest signature.

In another embodiment, a near-field material detection system uses a magnetic-based loop antenna that focuses on magnetic field interaction within close proximity to the target material. This system uses magnetic resonance principles, detecting changes in the magnetic field due to interactions with materials possessing magnetic susceptibility, such as ferromagnetic metals. The loop antenna generates a localized oscillating magnetic field, and when materials are introduced into the detection zone, they alter the field by inducing eddy currents or magnetic resonance effects. These changes are then measured to determine the material's properties. This method is particularly useful in applications such as industrial quality control or close-range security screening, where detecting the magnetic characteristics of a material offers clear advantages.

In another embodiment, far-field magnetic resonance techniques are employed for material detection at greater distances. This system operates by transmitting an electromagnetic wave where the magnetic field component is emphasized, focusing on its interaction with materials that have resonant magnetic properties. By tuning the system to specific resonant frequencies, materials that exhibit strong magnetic responses, such as certain alloys or ferromagnetic materials, can be detected over a larger range. The detection system then analyzes the phase or amplitude of the reflected wave to infer material characteristics. This embodiment is particularly suitable for remote sensing applications, such as geological surveys, where materials can be identified based on their magnetic resonance even when located at a distance from the detection apparatus.

In another embodiment, an array of antennas is used to simultaneously detect materials based on both RF and magnetic field interactions. The antenna array consists of dipole antennas optimized for detecting the electric component of the RF wave and loop antennas that focus on the magnetic field interaction. These two types of signals are combined to create a composite material signature, allowing for detailed analysis of both the dielectric and magnetic properties of the material. By processing both electric and magnetic field data, the system can more accurately identify materials that exhibit a combination of electrical conductivity and magnetic permeability, such as advanced composites or stealth materials. This dual-mode system can be particularly useful in defense or aerospace applications.

In another embodiment, a magnetic-based antenna system is designed for material detection in environments where RF signals would typically be degraded, such as underground or underwater. This system uses a loop antenna to generate a magnetic field that interacts with materials possessing strong magnetic properties, even in situations where RF signals are heavily attenuated. The antenna detects variations in the magnetic field caused by materials with high permeability, such as iron or nickel-based substances. This method allows for the detection of magnetic materials in conditions where RF detection would be unreliable, such as in deep-sea exploration or subterranean mining operations, where conventional RF signals would fail to penetrate effectively.

In another embodiment, a phased array system is designed specifically to manipulate the magnetic component of the electromagnetic wave for high-resolution material detection. A phased array of loop antennas is used to steer and focus the magnetic field, creating a directed magnetic beam that can scan across a target area. The system detects materials based on how they alter the magnetic field, allowing for precise location and identification of magnetic objects. By adjusting the phase and amplitude of each antenna element, the system provides a fine degree of control, enabling highly localized material detection. This approach is useful in situations requiring detailed spatial resolution, such as identifying hidden metallic objects in security screening or detailed inspections in industrial settings.

In another embodiment, a portable or wearable material detection system is implemented using a small, magnetic-based loop antenna for detecting magnetic materials in close proximity. This compact system allows security personnel or industrial workers to move through different environments while continuously monitoring for materials that exhibit magnetic properties. The loop antenna generates a localized magnetic field and detects perturbations caused by nearby magnetic materials, such as concealed weapons or magnetic tags. The system then alerts the user when such materials are detected, making it ideal for field operations where mobility and ease of use are desired.

In another embodiment, the material detection system is entirely RF-based, using a highly optimized RF antenna to detect materials based solely on their interaction with the RF field. The RF antenna transmits electromagnetic waves at specific frequencies, and the system analyzes how these waves are reflected, absorbed, or scattered by the material. By focusing on the dielectric constant or conductive properties of the target material, the system can accurately identify substances such as explosives, chemicals, or other dielectric materials. This approach is particularly effective in environments where magnetic field-based detection is unnecessary or less effective. The RF-based system can be adapted for wide-ranging applications, from industrial material testing to security scanning, where detecting the electrical characteristics of the material is sufficient for identification.

Figure 2:
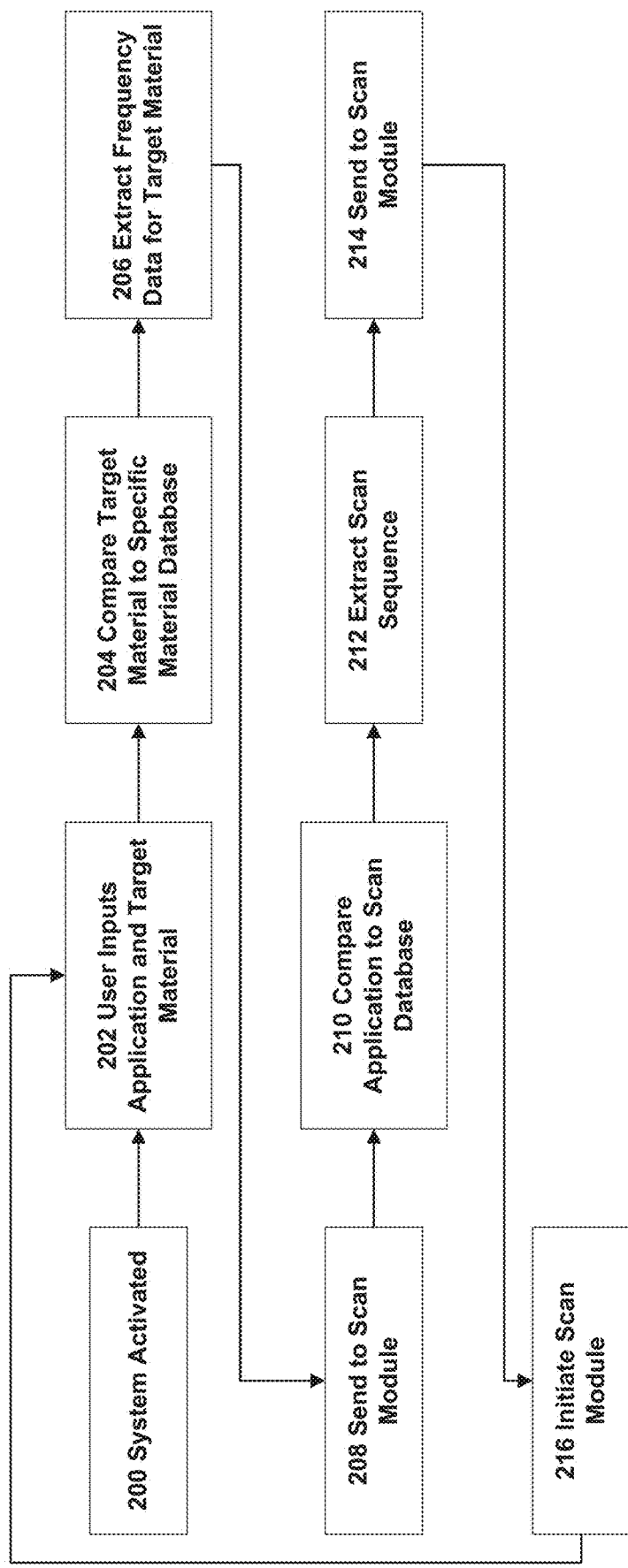
FIG. 2 illustrates a base module according to an embodiment.

FIG. 2 illustrates the base module 160. The process begins with the system being activated at step 200. The system may be activated by the user or operator. The user inputs, at step 202, the application and the target material on the control panel 152. The user may input the application for the RF detection device 102, such as medical, military, security, etc., as well as the target material on the control panel 152. In some embodiments, the user may send the inputs through a user device 180. The base module 160 compares, at step 204, the target material to the specific material database 168. The specific material database 168 may be used to configure the detection parameters to identify specific materials based on their unique electromagnetic properties. Each entry in the database may be defined by the material's atomic structure, which includes the total number of protons and neutrons. The unique nuclear composition allows each substance to be distinctly identifiable and detectable through its resonant frequency. The specific material database 168 may contain a unique material ID, the common name of the material, the number of protons, the number of neutrons, and the atomic mass, which is the sum of protons and neutrons. The specific material database 168 may also contain calculated resonant frequencies based on the atomic characteristics.

The resonant frequencies are useful for configuring the transmitter unit of the RF detection system 102, which sends out signals at these specific frequencies to induce a resonant response in the target material. For example, the specific material database 168 may contain an entry for Arsenic (As) with 33 protons and 42 neutrons, resulting in an atomic mass of 75. The resonant frequencies for Arsenic could be 33 Hz, based on the number of protons, 42 Hz, based on the number of neutrons, and 75 Hz, based on the atomic mass. These frequencies may also be increased by orders of magnitude, such as 10× or 100×, to suit different detection environments. As stated above, these frequencies are provided for illustration, and the actual frequencies may be determined by experiment or simulation. In some embodiments, for compounds, the specific material database 168 calculates a combined frequency based on the sum of the resonant frequencies of the constituent elements. For example, a formaldehyde molecule composed of 16 protons and 14 neutrons with a total atomic mass of 30 may have corresponding frequencies of 16 Hz, 14 Hz, and 30 Hz, respectively. Another example may be smokeless gunpowder, specifically nitroglycerin, with the chemical composition $CH_2NO_3CHNO_3CH_2NO_3$. The frequency for this compound may be calculated by summing the frequencies based on the atomic numbers of its constituent elements: 6 carbon+ 1×2 hydrogen+7 nitrogen+8×3 oxygen, repeated thrice, resulting in a total of 116 protons. This is then multiplied by 10 to yield a base frequency of 1160 Hz for detection purposes. In some embodiments, the specific material database 168 may account for overlapping frequencies among different elements and compounds. To enhance the accuracy of detection, the system may employ multiple methods to calculate and verify the target material's frequency, such as using combinations of proton counts, neutron counts, and atomic masses, which allows the system to distinguish between materials with similar frequencies by leveraging the unique resonant properties of each substance.

The base module 160 extracts, at step 206, the frequency data for the target material from the specific material database 168. The base module 160 may extract the frequency data and signal data to detect the inputted target material. The base module 160 sends, at step 208, the extracted frequency for the target material to the scan module 162. The base module 160 sends the frequency data, signal data, etc., to the scan module 162.

The base module 160 compares, at step 210, the inputted application to the scan database 172. The scan database 172 may be previously created or previously stored database on the RF detection device 102 that contains pre-defined scanning patterns and positional data for the gimbal 138. The scan database 172 provides that the gimbal 138 follows specific movements and positions to comprehensively scan an environment or area, depending on the application, such as medical, military, or security. The scan database 172 allows for consistent, repeatable, and thorough coverage of the target area. In some embodiments, the scan database 172 may contain a variety of pre-defined scanning patterns tailored to different applications. The patterns dictate the movements the gimbal 138 follows to achieve sufficient or complete coverage of the environment. In some embodiments, users may define and store custom scan patterns to meet specific scenarios or adjust existing patterns based on operational conditions. In some embodiments, the scan database 172 may contain detailed positional data for each scan pattern, including the specific coordinates (X, Y, Z) the gimbal 138 moves to during the scan. In some embodiments, the scan database 172 may contain information on the orientation (pitch, yaw, roll) of the gimbal 138 at each position to achieve improved or optimal signal detection. In some embodiments, the scan database 172 may contain the sequence of movements and transitions between positions, ensuring a smooth and efficient scan. For example, for medical applications, scan patterns may be optimized for body scanning, ensuring thorough coverage of areas of interest, such as organs or tissues. For military applications, scan patterns may be designed for vehicle or area inspections, focusing on identifying hidden or dangerous materials. In some embodiments, the scan database 172 may include the scan duration, which may be the timing information specifying how long the gimbal 138 should remain at each position to take accurate readings. Time intervals between movements may be stored to allow for stable data acquisition and to minimize the impact of vibrations or external disturbances. For example, the scan database 172 contains patterns for scanning specific body parts, such as the liver, lungs, or brain, to detect cancerous tissues. The gimbal 138 follows predefined paths to facilitate thorough coverage of the target area, with positional data specifying the exact coordinates and orientation for each scan point.

The base module 160 extracts, at step 212, the scan sequence from the scan database 172. The base module 160 extracts the corresponding scan sequence for the inputted application, such as a medical application, including cancer screening. The base module 160 sends, at step 214, the extracted scan sequence to the scan module 162. The base module 160 sends the extracted scan sequence to the scan module 162 to allow the scan module 162 to send the gimbal 138 positions for the inputted application to provide that the entire environment or area is properly scanned by the RF detection device 102. The base module 160 initiates, at step 216, the scan module 162. The scan module 162 begins by being initiated by the base module 160 and receives the frequency data and scan sequence data. The scan module 162 then commands the gimbal 138 to position itself according to the first orientation in the scan sequence and sends the frequency data to the detection module 164, which is subsequently activated. The scan module 162 receives detection data from the detection module 164 and stores both the positioning and detection data in the detection database 170. The scan module 162 evaluates whether the target material is detected; if so, it activates the haptic module 166 to provide feedback. Regardless, it checks if additional positions remain in the scan sequence. If more positions are left, the gimbal 138 is commanded to move to the next orientation, and the process repeats. If no positions remain, control is returned to the base module 160.

Figure 3:
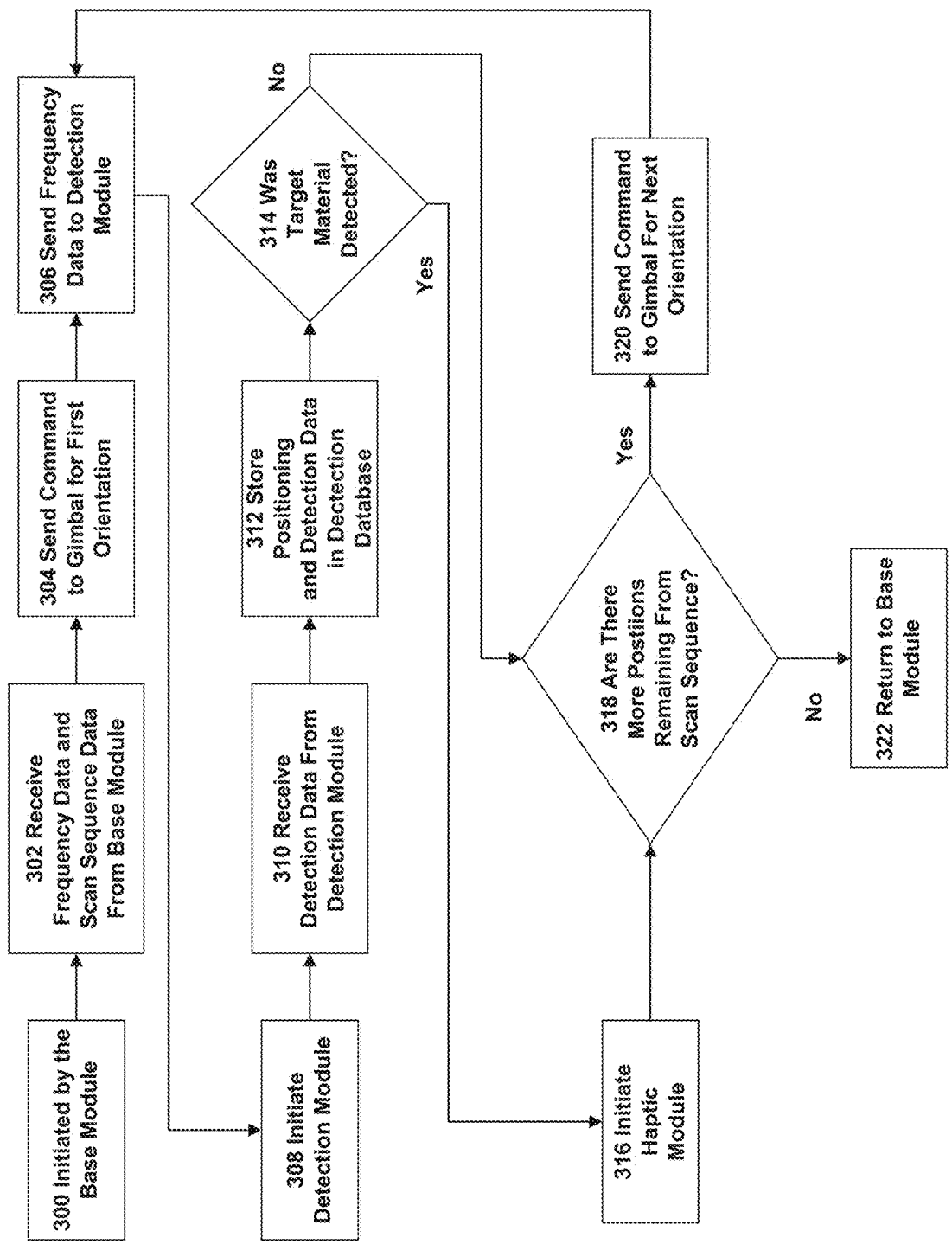
FIG. 3 illustrates a scan module according to an embodiment.

FIG. 3 illustrates the scan module 162. The process begins with the scan module 162 being initiated, at step 300, by the base module 160. The scan module 162 receives, at step 302, the frequency data and the scan sequence data from the base module 160. The scan module 162 receives the extracted data from the specific material database 168 and the scan database 172, allowing the scan module 162 to send the appropriate RF signal for the target material and allowing the gimbal 138 to be positioned correctly during the scan sequence. In some embodiments, the scan module 162 may store the received data in memory 156.

The scan module 162 sends, at step 304, a command to the gimbal 138 to position in the first orientation of the scan sequence. The scan sequence may be a variety of pre-defined scanning patterns tailored to different applications. The patterns dictate the movements the gimbal 138 follows to achieve sufficient or complete coverage of the environment. In some embodiments, users may define and store custom scan patterns to meet specific scenarios or adjust existing patterns based on operational specifications. In some embodiments, the scan sequence may contain detailed positional data, including the specific coordinates (X, Y, Z) the gimbal 138 move to during the scan. In some embodiments, the scan sequence may contain information on the orientation (pitch, yaw, roll) of the gimbal 138 at each position to facilitate sufficient or optimal signal detection. For example, for medical applications, scan patterns may be optimized for body scanning, providing thorough coverage of areas of interest, such as organs or tissues. Organs may include the skeleton, stomach, small intestine, large intestine, rectum, liver, gallbladder, mesentery, pancreas, lungs, kidneys, ureter, bladder, urethra, ovaries, testicles, prostate, thyroid, lymph node, spleen, brain, breast, or skin. Tissues may include bone or blood. For military applications, scan patterns may be designed for vehicle or area inspections, focusing on identifying hidden or dangerous materials.

The scan module 162 sends, at step 306, the frequency data to the detection module 164. The scan module 162 sends the frequency data, signal data, etc., to the detection module 164 to properly identify or detect the target material. The scan module 162 initiates, at step 308, the detection module 164. The detection module 164 begins by being initiated by the scan module 162. The detection module 164 receives frequency data and detection parameters for identifying the target material based on its unique electromagnetic properties. The detection module 164 commands the transmitter unit 106 to configure and generate the appropriate RF signal, which is then transmitted via the transmitter antenna 140. This signal interacts with the environment and target materials, producing changes detectable by the receiver unit 122. The receiver unit 122 captures and processes these changes, converting the RF signal back into electrical signals, which are then amplified, filtered, and digitized. The processed detection data is sent back to the scan module 162 for storage and further analysis. In some embodiments, if the target material is detected, the detection module 164 may provide feedback and continue scanning until all positions are covered. Finally, the detection module 164 returns control to the scan module 162.

The scan module 162 receives, at step 310, the detection data from the detection module 164. The scan module 162 may receive the detection data, such as the target material, if the target material was detected, the signal data, etc. The scan module 162 stores, at step 312, the positioning data and the detection data in the detection database 170. The detection database 170 may contain data, such as information on detected target materials, their positions, timestamps, and other relevant metadata. In some embodiments, the detection database 170 may serve as a central repository for all detection events, allowing users to analyze and interpret the findings accurately. In some embodiments, the target material may specify the type of material detected, such as cancerous tissue, explosives, or biohazardous substances. In some embodiments, the detection database 170 may include the material properties, such as density, composition, and any unique signatures that helped in its identification. In some embodiments, the detection database 170 may include the frequency data, signal data, etc., that was used to detect the target material. In some embodiments, the detection database 170 may include positioning data, such as coordinates that provide the exact location of the detected material, such as represented in a 3D coordinate system (X, Y, Z). In some embodiments, the positioning data may include the orientation of the RF detection device 102 at the time of detection, including pitch, yaw, and roll angles. In some embodiments, the positioning data may include the area coverage, such as the spatial extent or volume occupied by the detected material. In some embodiments, the timestamp data may include the date, time, duration of the detection event, etc. In some embodiments, the user may view the data stored in the detection database 170 on the user device 180, which may include analytical tools that allow users to perform statistical analysis, pattern recognition, and other advanced data processing. In some embodiments, the control panel 152 and/or the user device 180 may support visualizations of data through charts, graphs, and 3D models, enabling users to see the spatial distribution of detected materials.

For example, the detection database 170 may store detailed information on cancerous tissues detected during patient scans. Medical professionals can query the detection database 170 through the user device 180 to retrieve data on tumor locations, sizes, and properties, along with timestamps for each detection event. In some embodiments, 3D models of the tumor's position within the patient's body may be generated, aiding in diagnosis and treatment planning. For example, the detection database 170 may record instances of detected explosives or contraband in vehicles. Security personnel may access the detection database 170 through the control panel 152 or user device 180 to review detection events, including the specific location and type of detected materials. In some embodiments, visual maps of vehicles with highlighted areas of concern may be generated, facilitating efficient and thorough inspections.

In agricultural applications, scan patterns may be adapted for aerial drones equipped with the RF detection device. A grid or lawnmower pattern may be used to systematically cover large fields, identifying variations in soil composition or detecting early signs of pest infestations. This may enable targeted treatment and better crop management. For infrastructure monitoring, such as bridges or buildings, scan patterns may be programmed to focus on load-bearing elements. A zig-zag pattern across beam lengths or a radial pattern around pillars may be used to detect cracks, corrosion, or other structural weaknesses. For environmental monitoring, scan patterns may include a concentric circular pattern around suspected pollution sources, such as industrial discharge areas or landfill sites. This may help in mapping the spread of contaminants in soil or water, providing data for environmental protection efforts. In archaeology, scan patterns may be tailored for subsurface exploration to detect buried structures or artifacts without invasive digging. A cross-hatch pattern may be used over areas of historical interest to provide comprehensive coverage and improve the chances of discovery while preserving site integrity. For underwater exploration, a three-dimensional grid pattern may be useful in scanning sea beds or shipwrecks. This approach may help in mapping complex underwater terrains and identifying objects of interest in cluttered environments, aiding in archaeological studies or recovery missions.

The scan module 162 determines, at step 314, if the target material was detected by the detection module 164. The scan module 162 may determine if the target material was detected through the detection data received from the detection module 164. In some embodiments, the scan module 162 may receive a yes or no response from the detection module 164 to determine if the target material was detected. If it is determined that the target material was detected by the detection module 164 the scan module 162 initiates, at step 316, the haptic module 166. The haptic module 166 is initiated if the scan module 162 determines that the target material was detected. The haptic module 166 then activates the haptic apparatus 174 to notify or inform the user of the detection of the target material and returns to the scan module 162. If it is determined that the detection module 164 did not detect the target material or after the haptic module 166 is initiated, the scan module 162 determines, at step 318, if more positions remain in the scan sequence. In some embodiments, the scan module 162 may extract the next position or orientation of the gimbal 138 from memory 156 and send a command to the gimbal 138 for the new position, location, or orientation. If it is determined that more positions are remaining in the scan sequence, the scan module 162 sends, at step 320, a command to the gimbal 138 to be positioned in the next orientation of the scan sequence, and the process returns to sending the frequency to the detection module 164. If it is determined that no more positions are remaining in the scan sequence, the scan module 162 returns, at step 322, to the base module 160.

One embodiment involves integrating the directional shield 148 with the gimbal 138 to enhance material detection accuracy. In this setup, the directional shield 148 can be dynamically adjusted to selectively block portions of the RF signals, helping to isolate and identify the source of the detected signals more precisely. For example, if the reference frequency of a target material is detected, the gimbal 138 can move the directional shield 148 to different positions to see if the signal strength decreases. If the signal is lost when a specific portion is shielded, this data can help pinpoint the material's exact location. This method leverages the cutoff position of the directional shield 148 to refine the material's location, thus improving the detection accuracy.

In another embodiment, the gimbal 138 and directional shield 148 are used for detecting moving materials. The scan module 162 commands the gimbal 138 to follow a predefined path, and the directional shield 148 can be adjusted to focus the RF signals in the direction of the suspected movement. By dynamically altering the shield's position, the system can track the material as it moves through the detection area. This application is particularly useful in security scenarios where tracking the movement of contraband or hazardous materials is desired. The interaction between the gimbal 138 and directional shield 148 provides real-time updates on the material's location, enabling timely responses.

In another embodiment, in environmental monitoring, the directional shield 148 is used to minimize interference from surrounding noise sources. The gimbal 138 positions the shield to block unwanted RF signals from non-target areas, enhancing the signal-to-noise ratio for better detection of the material of interest. For instance, in detecting specific chemicals in a polluted area, the shield can be moved to different angles to provide that only signals from the target chemicals are received. This approach helps to filter out background noise and improves the accuracy and reliability of the detection process.

The gimbal 138 and directional shield 148 can be used for precision inspections of machinery and components. The scan module 162 commands the gimbal 138 to position the directional shield 148 to concentrate the RF signals on specific parts of the machinery, allowing for detailed inspection and detection of wear, corrosion, or material defects. By adjusting the shield to focus on different sections, the system can provide comprehensive coverage and high-resolution data on the condition of the machinery, helping to prevent failures and optimize maintenance schedules.

Figure 4:
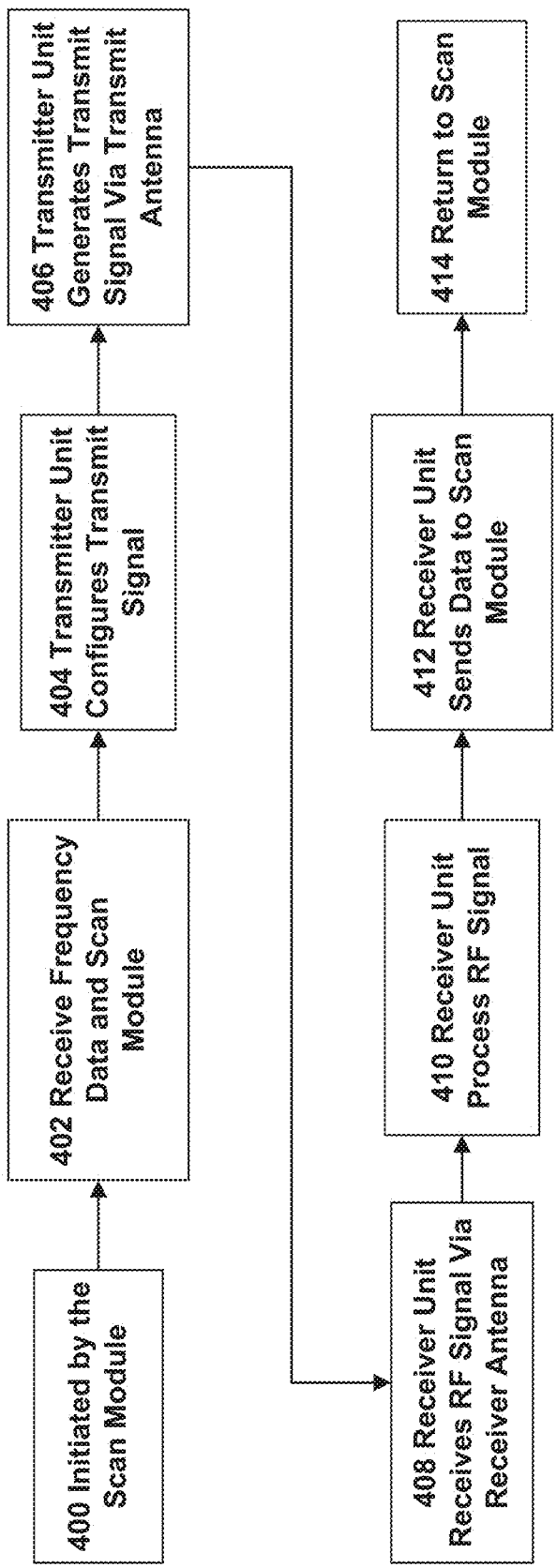
FIG. 4 illustrates a detection module according to an embodiment.

FIG. 4 illustrates the detection module 164. The process begins with the detection module 164 being initiated, at step 400, by the scan module 162. In some embodiments, the detection module 164 may be initiated once the frequency data, signal data, etc., is received. The detection module 164 receives, at step 402, the frequency data from the scan module 162. The detection module 164 receives the detection parameters, such as the frequency data, signal data, etc., to identify the specific target material based on its unique electromagnetic properties. The unique nuclear composition allows each substance to be distinctly identifiable and detectable through its resonant frequency. The detection module 164 commands, at step 404, the transmitter unit 106 to configure the transmit signal. The transmitter unit 106 prepares the signal that will be transmitted for the purpose of detecting a target material. In some embodiments, the parameters and components may be set up with the desired characteristics to generate the RF signal. The control panel 152 determines the specific parameters of the RF signal to be generated. The parameters may include the frequency, amplitude, and modulation type to effectively detect the target materials. Once the parameters are set, the control panel 152 sends a command to activate the oscillator 110 circuit 108 within the transmitter unit 106. The oscillator circuit 108 may be responsible for generating a stable RF signal at the desired frequency and may include components like capacitors, inductors, and amplifiers that work together to create the oscillating signal. The power delivery to the oscillator circuit 108 may be managed by the SCR 114. When the control panel 152 sends a gate signal to the SCR 114, it switches from a non-conductive to a conductive state, allowing current from the power source, such as batteries, to flow to the oscillator circuit 108. After the oscillator circuit 108 generates the RF signal, the transformer 116 adjusts the voltage level of the signal to match the specifications of the transmit antenna 140. It may also provide impedance matching to achieve efficient signal transmission. The transformer 116 provides that the RF signal is at the appropriate voltage and current levels for optimal transmission. For example, the control panel 152 may determine that an RF signal with a frequency of 50 Hz can detect a specific material. It sends a command to the transmitter unit 106 to configure this signal. The oscillator circuit 108 is activated, generating an RF signal at 50 Hz. The SCR 114 is triggered, allowing power from the batteries to flow to the oscillator circuit 108. The generated signal is then conditioned by the transformer 116, ensuring it is at the correct voltage level for transmission.

The detection module 164 commands, at step 406, the transmitter unit 106 to generate the transmit signal via the transmit antenna 140. The transmitter unit 106 generates the RF signal and transmits it through the transmit antenna 140 by converting electrical energy into radio waves that can be used for detecting specific materials. The transmit antenna 140 radiates the RF signal into the environment. The radio waves propagate through the medium, such as air or ground, and interact with the target materials. The interaction between the RF signal and the target materials will produce detectable changes in the signal, which can be received and analyzed by the receiver unit 122. For example, the transmitter unit 106 generates a wave pulse at a specified frequency that is transmitted directionally into the ground. The generated frequency is closely approximate or exact to that of the target material, and that relationship creates a responsive RF wave and/or a magnetic line between the transmitter antenna 140 and the target. When the RF detection device 102 is aligned with a target material, for example, when the opening of the directional shield 148 is pointing toward the target material, the voltage produced by the receiver antenna 142 changes and thereby produces a detection output signal, such as an audio signal having a tone different than that of the baseline. A reflective wave is produced by the target material that amplifies, resonates, offsets, or otherwise modifies the magnetic field passing through the receiver antenna 142 to alter the voltage produced, thereby generating the output signal. The receiver antenna 142 is responding to a voltage increase from the transmitter antenna 140 swinging over the magnetic line to the material.

The detection module 164 commands, at step 408, the receiver unit 122 to receive RF signal via receiver antenna 142. The receiver unit 122 captures the RF signal that has interacted with the environment and potential target materials using the receiver antenna 142. The receiver antenna 142 captures the incoming RF signal, which has been transmitted by the transmitter unit 106 and has interacted with the environment and any target materials present. The receiver antenna 142 may be designed to effectively capture these radio waves and convert them back into electrical signals. Once the RF signal is received by the receiver antenna 142, it may be fed into an RF amplifier, which boosts the signal strength without significantly altering its characteristics. In some embodiments, the use of the standard atomic structure of a material may be used to calculate the resonant frequency to which a particular substance would generate or respond. Each element and compound includes a definable atomic structure composed of the total number of protons and neutrons of that target material. This unique nuclear composition of every substance makes it uniquely identifiable and detectable. The manner in which this information is applied thus enables the detection of any target substance. A target material can be detected and located based on a resonant, responsive RF wave and/or magnetic relationship between the target and a transmitter antenna 140 transmitting at a frequency specific and unique to the target material. The transmitter unit 106, through the transmitter antenna 140, induces a resonance due to responsive RF waves and/or magnetic and/or otherwise in a targeted material to resonate at a specific computed frequency. The receiver antenna 142 and receiver circuit 124 detect the resonance induced in the material and, in so doing, indicate the approximate line of bearing to the material. The primary method used by this detection system to detect specific materials is based on tuning the circuit 108 of the transmitter unit 106 to a specific value that is computed for the material of interest. The frequency can be based on any of the three defining characteristics of the substance, the number of protons, the number of neutrons, or the atomic mass, such as the sum of protons and neutrons and combinations thereof. The frequency can be transmitted at varying voltages to compensate for other external effects or interference. In some embodiments, the specific material database 168 containing characteristics of common materials may be used to calculate the resonant frequencies. To accomplish this tuning, the frequency of the signal from the transmitter antenna 140 may be set to some harmonic of the elements of the material.

The detection module 164 commands, at step 410, the receiver unit 122 to process the RF signal. The receiver unit 122 processes the received RF signal to extract meaningful data that can be analyzed for the presence of specific materials, which may involve further amplification, filtering, digitization, and initial data processing before the signal is sent to the control panel 152 for detailed analysis. In some embodiments, after the RF signal is received and initially amplified, it may involve further amplification to provide the signal is at a sufficient or optimal level for processing. In some embodiments, an additional RF amplifier within the receiver unit 122 may boost the signal strength while maintaining its integrity. The amplified signal may be subjected to more advanced filtering by the filter circuit, which removes any residual noise and unwanted frequencies that might have passed through the initial filtering stage. In some embodiments, the filtering may involve bandpass filters that allow only the desired frequency range to pass through. The filtered analog signal may be converted into a digital format using an Analog-to-Digital Converter, ADC. The ADC samples the analog signal at a high rate and converts it into a series of digital values. The digitized signal may be processed using digital techniques. The digital signal may be fed into a Digital Signal Processor, DSP, within the receiver unit 122. In some embodiments, the DSP may perform initial data processing tasks such as demodulation, noise reduction, and feature extraction. Demodulation involves extracting the original information-bearing signal from the carrier wave. Noise reduction techniques may further clean the signal, making it easier to analyze. Feature extraction may involve identifying characteristics of the signal that are indicative of the presence of target materials.

The detection module 164 commands, at step 412, the receiver unit 122 to send the detection data to the scan module 162. The receiver unit 122 transmits the processed data to the scan module 162 to be stored. In some embodiments, further analysis and decision-making may be performed, which may involve packaging the data in a suitable format, establishing a communication link, and ensuring the accurate and secure transmission of the data from the receiver unit to the control panel 152, user device 180, etc. The resultant data from the DSP process is organized and packaged, which may involve structuring the data into packets, adding metadata such as timestamps and identifiers, and incorporating error-checking codes to achieve data integrity during transmission. In some embodiments, the receiver unit 122 may establish a communication link with the control panel 152 through wired connections, such as coaxial cables, or wireless communication protocols, such as Wi-Fi, Bluetooth, etc. The receiver unit 122 sends the packaged data over the established communication link. In some embodiments, the digital data packets may be converted into a format suitable for transmission over the communication link. In some embodiments, the control panel 152 receives the transmitted data packets and may demodulate the incoming signals, if wireless, and reconstruct the original data packets. In some embodiments, the control panel 152 may perform error-checking using the codes embedded in the packets to provide that the data has been transmitted accurately and without corruption. In some embodiments, the control panel 152 may use advanced algorithms and stored profiles of target materials to analyze the received data. In some embodiments, the control panel 152 may make decisions based on the analysis regarding the presence of target materials. In some embodiments, the control panel 152 may trigger alerts, log the detection event, or initiate further actions under the detection system's operational protocol. The detection module 164 returns, at step 414, to the scan module 162.

Figure 5:
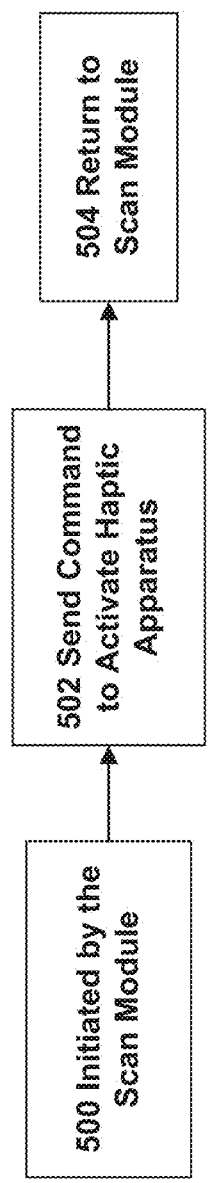
FIG. 5 illustrates a haptic module according to an embodiment.

FIG. 5 illustrates the haptic module 166. The process begins with the haptic module 166 being initiated, at step 500, by the scan module 162. In some embodiments, the haptic module 166 may be initiated by the detection module 164. In some embodiments, the haptic module 166 may continuously send a query to the detection database 170 for new data entries, and if a new data entry is stored and contains information that a target material is detected, the haptic module 166 sends a command to the haptic apparatus to be activated. The haptic module 166 sends, at step 502, a command to activate the haptic apparatus 174. The haptic apparatus 174 may be a system or device that provides tactile feedback to a user through the application of forces, vibrations, or motions. The feedback may be designed to simulate the sense of touch, enabling users to feel physical sensations that correspond to interactions with digital or virtual objects. The haptic apparatus 174 may provide realtime tactile feedback to the operator of the RF detection device 102, enhancing the usability and effectiveness of the device by conveying important information through touch. In some embodiments, the feedback may signal various states of the device, such as the detection of a signal, directionality, or proximity to a target. In some embodiments, the haptic apparatus 174 may include vibration motors, such as eccentric rotating mass, which creates vibrations by spinning an off-center weight, or linear resonant actuator, which produces vibrations by moving a mass linearly instead of rotating it. In some embodiments, the haptic apparatus 174 may include piezoelectric actuators, such as piezo buzzers, which use piezoelectric materials to create vibrations or tones when an electric field is applied, or piezo haptic actuators, which create a variety of tactile sensations. In some embodiments, the haptic apparatus 174 may include electroactive polymers, which may be materials that change shape when an electric field is applied, producing a wide range of haptic feedback effects. In some embodiments, the haptic apparatus 174 may include force feedback devices, such as haptic joysticks or levers, which provide resistance or force feedback, simulating the feeling of interacting with physical objects.

In some embodiments, the haptic apparatus 174 may include ultrasonic haptics, such as ultrasonic waves, which may create the sensation of touch in mid-air. In some embodiments, vibration motors may be used to indicate the direction in which the RF detection device 102 should be pointed. For example, stronger vibrations on one side of the handle can signal that the operator should move the device in that direction. In some embodiments, the intensity and pattern of vibrations may be varied to indicate the strength of a detected signal. Stronger or more frequent vibrations may denote a stronger signal, helping the operator zero in on the target. In some embodiments, the haptic apparatus 174 may be integrated with the device's control panel 152, providing tactile feedback in response to user inputs or system alerts. In some embodiments, the haptic apparatus 174 may be programmed to deliver specific patterns of vibrations or forces based on different scenarios. For example, a short, sharp buzz may indicate the detection of a signal, while a long, pulsing vibration may signal proximity to a target. Feedback on scan completeness may be provided by the gimbal 138 through haptic feedback to indicate the progress of a scanning session. For example, a series of vibrations may signify the completion of scanning in one direction, prompting the user to move to the next segment or area.

Error notification may be delivered if there is a malfunction or if the gimbal 138 moves out of the optimal scanning range or position, with the haptic system immediately alerting the user by delivering a distinct pattern of vibrations or a sudden change in intensity, ensuring that scanning errors are minimized. Material differentiation may be indicated by using different types of vibrations or haptic patterns to signify the type of material detected. For instance, a continuous buzz may denote the presence of metals, while a pattern of short pulses may indicate organic materials, providing immediate physical feedback that could be invaluable in applications like security or environmental monitoring. Safety warnings may be provided in hazardous environments, such as chemical plants or during explosive material detection, with the gimbal 138 programmed to deliver urgent haptic feedback upon detecting a dangerous substance, ensuring that the user is immediately aware of potential dangers. Multi-layer feedback may be used for complex scanning tasks, such as in medical diagnostics or structural analysis, with the gimbal 138 may employ layered haptic feedback to indicate different layers or depths of the scan. For example, a softer vibration may indicate surface layers, while deeper layers might trigger a more intense vibration. Confirmatory feedback may be provided after a successful scan or upon confirmation of a target's properties, with the gimbal 138 delivering a specific haptic signal, such as a vibration pattern that mimics a tick or a cross, to confirm the results to the user without needing to look at a display. The haptic module 166 returns, at step 504, to the scan module 162.

The functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

What is claimed is:

1. A method for material detection and identification, the method comprising:
accessing a material database for a target material, the material database storing data on a plurality of materials and corresponding resonance frequencies;
extracting, from the material database, a resonance frequency for the target material;
comparing an application type to entries in a scan database, wherein the scan database stores pre-defined scanning patterns and corresponding application types;

extracting, from the scan database, a scan sequence for the application type;

instructing a gimbal to follow positions in a pre-defined scanning pattern of the scan sequence;

transmitting into an environment an RF signal at the resonance frequency when the gimbal is at the positions in the pre-defined scanning pattern of the scan sequence;

receiving a response signal from the environment;

analyzing the response signal for resonance characteristics that indicate a presence of the target material; and generating a haptic feedback when the target material is detected.

2. The method of claim 1, wherein the positions in the pre-defined scanning pattern comprise X, Y, Z coordinates of the gimbal.

3. The method of claim 1, wherein the positions in the pre-defined scanning pattern comprise pitch, yaw, roll orientations of the gimbal.

4. The method of claim 1, wherein the application type is a medical application, and the pre-defined scanning pattern is configured to cover an organ of interest.

5. The method of claim 1, wherein the application type is a medical application, and the pre-defined scanning pattern is configured to cover a tumor.

6. The method of claim 1, wherein the application type is a military application, and the pre-defined scanning pattern is configured to cover a vehicle.

7. The method of claim 1, further comprising storing positioning data associated with transmitting in a detection database.

8. The method of claim 7, wherein the positioning data comprises a spatial extent or a volume occupied by the target material.

9. The method of claim 1, wherein an intensity of the haptic feedback is related to a strength of the response signal.

10. The method of claim 1, wherein a pattern of the haptic feedback is related to a strength of the response signal.

11. The method of claim 1, wherein:
the haptic feedback is a first haptic feedback, and
the method further comprises:
generating a second haptic feedback to indicate progress of the gimbal through the positions in the pre-defined scanning pattern of the scan sequence.

12. A system for material detection and identification, the system comprising:

an RF transmitter unit configured to transmit into an environment an RF signal at a resonance frequency;

an RF receiver unit configured to receive a response signal from the environment;

a multi-axis gimbal operably coupled to at least one of an RF transmitter antenna and an RF receiver antenna, wherein the multi-axis gimbal is configured to position at least one of the RF transmitter antenna and the RF receiver antenna;

a position detector sensor configured to provide a position of the multi-axis gimbal, wherein the position detector sensor comprises an encoder, gyroscope, or an accelerometer;

a scan module configured to control the position of the multi-axis gimbal; and a haptics feedback apparatus configured to indicate the position of the multi-axis gimbal or an intensity of the response signal.

13. The system of claim 12, further comprising a computer-readable medium storing a scan database, wherein the scan database comprises pre-defined scanning patterns and corresponding application types.

14. The system of claim 12, further comprising a computer-readable medium storing a materials database, wherein the materials database comprises data on a plurality of materials and corresponding resonance frequencies.

15. The system of claim 12, further comprising a computer-readable medium storing a detection database, wherein the detection database comprises data on materials detected by the system.

16. The system of claim 15, wherein the data on materials detected by the system comprises locations of the materials detected by the system.

17. The system of claim 12, further comprising a processor configured to analyze the response signal for resonance characteristics that indicate a presence of a material and identifying the material to a user if the presence of the material is indicated by the resonance characteristics.

18. The system of claim 12, further comprising a directional shield configured to direct or block electromagnetic radiation in a specific direction.

19. The system of claim 12, wherein the haptics feedback apparatus comprises a vibration motor, a linear resonant actuator, a piezoelectric actuator, or an electroactive polymer.

* * * * *